United States Patent
Aiba et al.

(10) Patent No.: US 10,135,032 B2
(45) Date of Patent: Nov. 20, 2018

(54) METHOD FOR PRODUCING LIGHT-EMITTING DISPLAY DEVICE, LIGHT-EMITTING DISPLAY DEVICE AND LIGHT-EMITTING DISPLAY

(75) Inventors: Satoshi Aiba, Kanagawa (JP); Toshiro Takahashi, Kanagawa (JP)

(73) Assignee: UDC IRELAND LIMITED, Dublin (IE)

( * ) Notice: Subject to any disclaimer, the term of this patent is extended or adjusted under 35 U.S.C. 154(b) by 530 days.

(21) Appl. No.: 13/254,504

(22) PCT Filed: Feb. 4, 2010

(86) PCT No.: PCT/JP2010/052011
§ 371 (c)(1),
(2), (4) Date: Sep. 2, 2011

(87) PCT Pub. No.: WO2010/101011
PCT Pub. Date: Sep. 10, 2010

(65) Prior Publication Data
US 2011/0317429 A1 Dec. 29, 2011

(30) Foreign Application Priority Data

Mar. 3, 2009 (JP) .................. 2009-049726
Dec. 25, 2009 (JP) .................. 2009-294999

(51) Int. Cl.
*H01L 51/00* (2006.01)
*H01L 51/52* (2006.01)

(52) U.S. Cl.
CPC ................. *H01L 51/5265* (2013.01)

(58) Field of Classification Search
CPC .................................................. H01L 51/5265

USPC ........................................... 427/64
See application file for complete search history.

(56) References Cited

U.S. PATENT DOCUMENTS

| | | | |
|---|---|---|---|
| 5,682,402 A | * | 10/1997 | Nakayama .......... H01L 51/5262 372/39 |
| 6,306,559 B1 | * | 10/2001 | Tanamura et al. ............ 430/315 |
| 6,469,438 B2 | * | 10/2002 | Fukuoka et al. .............. 313/504 |
| 2003/0022403 A1 | * | 1/2003 | Shimoda ................ B82Y 10/00 438/14 |

(Continued)

FOREIGN PATENT DOCUMENTS

EP 1 722 604 A1 11/2006
EP 1 737 276 A1 12/2006

(Continued)

OTHER PUBLICATIONS

International Search Report, dated Jun. 9, 2010 in PCT/JP2010/052011.

*Primary Examiner* — Robert A Vetere
(74) *Attorney, Agent, or Firm* — Riverside Law LLP

(57) ABSTRACT

A method for producing a light-emitting display device, the method including forming a film of a light-transmissive resin material on a substrate over which a reflective metal and a semi-transparent member can be disposed in at least one of a plurality of pixel regions corresponding to red, green and blue; curing part of the film of the light-transmissive resin material to form a light-transmissive resin layer, the part being in a region including the at least one pixel region; and developing the light-transmissive resin layer after the curing to form an optical path length-adjusting layer.

18 Claims, 12 Drawing Sheets

(56) References Cited

U.S. PATENT DOCUMENTS

| | | | |
|---|---|---|---|
| 2004/0002277 A1* | 1/2004 | Kuo | H01L 21/67207 445/61 |
| 2004/0113547 A1* | 6/2004 | Son | C09K 11/06 313/504 |
| 2005/0073230 A1* | 4/2005 | Nishikawa et al. | 313/111 |
| 2005/0142976 A1 | 6/2005 | Suzuki | |
| 2005/0248929 A1* | 11/2005 | Kawamura et al. | 362/84 |
| 2006/0061525 A1* | 3/2006 | Kim | G09G 3/3233 345/76 |
| 2006/0063351 A1* | 3/2006 | Jain | 438/455 |
| 2006/0066702 A1* | 3/2006 | Sakurai | H01L 51/0005 347/102 |
| 2007/0015429 A1 | 1/2007 | Maeda et al. | |
| 2007/0120464 A1* | 5/2007 | Okutani | B82Y 20/00 313/501 |
| 2008/0203902 A1* | 8/2008 | De Kok | H01L 51/5036 313/504 |
| 2009/0215354 A1 | 8/2009 | Maeda et al. | |

FOREIGN PATENT DOCUMENTS

| | | |
|---|---|---|
| EP | 2 159 843 A2 | 3/2010 |
| JP | 2005-235467 | 9/2005 |
| JP | 2006-253015 | 9/2006 |
| JP | 2006041471 | 9/2006 |
| JP | 2006-269329 A | 10/2006 |
| JP | 2006-302748 | 11/2006 |
| JP | 2007-16214 | 1/2007 |
| JP | 2007-503093 A | 2/2007 |
| JP | 2008515131 | 5/2008 |
| JP | 2008-530811 | 8/2008 |
| JP | 2008-218081 | 9/2008 |
| JP | 2009-259731 | 11/2009 |
| WO | 2005/020344 A1 | 3/2005 |
| WO | 2006/035956 | 4/2006 |

* cited by examiner

METHOD FOR PRODUCING LIGHT-EMITTING DISPLAY DEVICE, LIGHT-EMITTING DISPLAY DEVICE AND LIGHT-EMITTING DISPLAY

TECHNICAL FIELD

The present invention relates to a method for producing a light-emitting display device containing an optical path length-adjusting layer, the method having a simple production process; to a light-emitting display device produced through a simple production process; and to a light-emitting display.

BACKGROUND ART

In recent years, in place of cathode-ray tubes (CRTs), thin, light flat panel displays have been increasingly used in a wide variety of fields. This is because personal information terminals such as personal computers and network accessible cellular phones have been popular at an accelerated pace as a result of development of information equipment and infrastructure for Internet-centered service systems. Such flat panel displays have also been used as household-use TVs instead of predominantly used conventional CRTs.

In particular, organic electroluminescence elements (organic EL elements) are devices which attract large attention in recent years. Organic EL elements emit light in response to electrical signals, and contain organic compounds as a light-emitting compound. Organic EL elements intrinsically have excellent display properties such as wide viewing angle, high contrast and high-speed response. Furthermore, they can realize thin, light, high-definition display devices from a small size to a large size. Thus, interest has focused on them as elements which will take the place of CRTs or LCDs.

There have been proposed various full-color display devices using organic electroluminescence elements. In one method for obtaining full-color images using three primary colors; i.e., red (R), green (G) and blue (B), color filters are used in combination with white organic ELs. In such full-color display devices, attempts have been made to form a top emission-type full-color display device and a bottom emission-type full-color display device. The top emission-type full-color display device contains a semi-transparent cathode as an upper electrode, and realizes high color reproducibility by extracting only light that has a specific wavelength outside the organic EL element through the multiple interference effect obtained between a light reflective film and the semi-transparent cathode. The bottom emission-type full-color display device contains a dielectric multilayer mirror under a semi-transparent or transparent lower electrode.

For example, among organic EL elements formed by laminating, in sequence, a first electrode made of a light reflective material, an organic layer containing an organic light-emitting layer, a light semi-transparent reflective layer and a second electrode made of a transparent material so that the organic layer becomes a resonance part, known is an organic EL element formed so that L (optical distance) in the following equation becomes the positive minimum value:

$$(2L)/\lambda + \Phi/(2\pi) = m$$

where L denotes an optical distance (optical path length), λ denotes a peak wavelength of the spectrum of light intended to be extracted (or a wavelength of light intended to be extracted), m is an integer and Φ denotes a phase shift.

In full-color display devices employing such white organic EL in combination with color filters, by changing the thickness of an anode made of an inorganic material (e.g., indium tin oxide (ITO)), the optical path length L of each pixel is adjusted for extracting light of each color (see, for example, Patent Literatures 1 and 2).

However, when an inorganic material such as ITO is used in an optical path length-adjusting layer, the production process for a light-emitting display device becomes complicated, leading to elevation of the production cost and reduction of productivity.

For example, next will be described a conventional production process for a light-emitting display device containing an optical path length-adjusting layer.

First, reflective metals 2 are disposed on a substrate 1 so as to correspond red, green and blue pixels (see FIG. 12).

Next, an ITO film 10 is formed by, for example, sputtering or vapor deposition on the substrate on which the reflective metals 2 have been disposed (see FIG. 13).

Next, a resist composition containing a curable resin is applied on the ITO film 10 to form a resist layer 20 (see FIG. 14).

In the state where the reflective metals 2, the ITO film 10 and the resist layer 20 are disposed on the substrate 1, the resist layer 20 is covered with a mask 4 allowing it to be partially exposed to light, and the resist layer 20 in one pixel is selectively exposed to light L for curing the resin (see FIG. 15).

The exposed resist layer 20 is developed to remove the portions other than the exposed portions (see FIG. 16).

In this state, etching is performed using the residual resist layer 20 as a mask to remove the ITO film 10 except the ITO film 10 under the residual resist layer 20 (see FIG. 17).

Next, the resist layer 20 on the residual ITO film 10 is removed to establish a state where the reflective metal 2 and the ITO film 10 are disposed in one pixel (see FIG. 18).

Next, in order to form different optical path lengths, an ITO film 10 is formed again by, for example, sputtering or vapor deposition (see FIG. 19). As a result, in the one pixel region, the ITO film 10 is superposed on the ITO film 10 already formed on the reflective metal 2 in the previous step, thereby forming the difference in optical path length between the ITO film 10 in the one pixel region and that in the other pixel regions.

Next, a resist composition containing a curable resin is applied again on the ITO film 10 to form a resist layer 20 (see FIG. 20).

In the state where the reflective metals 2, the ITO film 10 and the resist layer 20 are disposed on the substrate 1, the resist layer is covered with a mask 4 allowing it to be partially exposed to light, and the one pixel region in which the ITO films 10 have been superposed each other and the adjacent pixel region thereto are exposed to light for curing the resin (see FIG. 21).

The exposed resist layer 20 is developed to remove the portions other than the exposed portions (see FIG. 22).

In this state, etching is performed using the residual resist layer 20 as a mask to remove the ITO film 10 except the ITO film 10 under the residual resist layer 20 (see FIG. 23).

Next, the resist layer 20 on the residual ITO film 10 is removed to form, on the substrate 1, a pixel region in which the reflective metal 2 and the superposed ITO films 10 have been formed and a pixel region in which the reflective metal 2 and the ITO film 10 have been formed (see FIG. 24).

Next, in order to further form different optical path lengths, an ITO film 10 is formed again by, for example, sputtering or vapor deposition (see FIG. 25). As a result, in two pixel regions in which the reflective metal 2 and the ITO film 10 have been formed, the ITO film 10 is superposed on the ITO film 10 already formed in the previous step, thereby forming the differences in optical path length by the thickness of the ITO film 10.

Next, a resist composition containing a curable resin is applied again on the ITO film 10 to form a resist layer 20 (see FIG. 26).

In the state where the reflective metals 2, the ITO film 10 and the resist layer 20 are disposed on the substrate 1, the resist layer is covered with a mask 4 allowing it to be partially exposed to light, and the resist layer 20 on each pixel is exposed to light for curing the resin (see FIG. 27).

The exposed resist layer 20 is developed to remove the portions other than the exposed portions (see FIG. 28).

In this state, etching is performed using the residual resist layer 20 as a mask to remove the ITO film 10 except the ITO film 10 under the residual resist layer 20 (see FIG. 29).

Next, the resist layer 20 on the residual ITO film 10 is removed to form optical path length-adjusting layers each being made of the ITO film 10 and having different thicknesses on each reflective metal 2 in each pixel region on the substrate 1 (see FIG. 30).

Next, in the state where the optical path length-adjusting layers each being made of the ITO film 10 and having different thicknesses are formed, an organic light-emitting layer 7 and a semi-transparent member 8 are formed in this order on each optical path length-adjusting layer, to thereby produce a light-emitting display device 400.

In the light-emitting display device 400, lights having been emitted from the organic light-emitting layers 7 are extracted from the semi-transparent member 8 as those having wavelengths of blue, green and red corresponding to the optical path lengths $d_1$, $d_2$ and $d_3$ of the ITO films 10 with different thicknesses.

That is, lights having been emitted from the organic light-emitting layers 7 are resonated between the semi-transparent members 8 and the reflective metals 2 (i.e., through optical paths with lengths of $d_1$, $d_2$ and $d_3$). As a result, lights having wavelengths of blue, green and red corresponding to the optical path lengths are intensified and can be extracted from the light-emitting display device 400 as blue, green and red lights.

As described above, the light-emitting display devices having the optical path length-adjusting layers realize highly definite full-color display by three primary colors of blue, green and red. But, when an inorganic material (e.g., ITO) is used for forming the optical path length-adjusting layer, the formation of the differences in optical path length requires formation of a resist layer, etching using the resist layer as a mask, and removal of the resist layer. In addition, these treatments must be performed every time when each optical path length difference is formed, leading to cumbersome production process.

CITATION LIST

Patent Literature

PTL 1: Japanese Patent Application Laid-Open (JP-A) No. 2007-503093
PTL 2: JP-A No. 2006-269329

SUMMARY OF INVENTION

Technical Problem

The present invention solves the existing problems and aims to achieve the following objects. Specifically, the present invention aims to provide a method for producing a light-emitting display device containing an optical path length-adjusting layer, the method having a simple production process; a light-emitting display device produced through a simple production process; and a light-emitting display.

Technical Solution

Means for solving the above problems are as follows.

<1> A method for producing a light-emitting display device, the method including:
forming a film of a light-transmissive resin material on a substrate over which a reflective metal and a semi-transparent member can be disposed in at least one of a plurality of pixel regions corresponding to red, green and blue,
curing part of the film of the light-transmissive resin material to form a light-transmissive resin layer, the part being in a region including the at least one pixel region, and
developing the light-transmissive resin layer after the curing to form an optical path length-adjusting layer.

<2> The method according to <1> above, wherein the forming the film of the light-transmissive resin material is performed by a vapor-phase film forming method.

<3> The method according to <2> above, wherein the vapor-phase film forming method is a flash evaporation method.

<4> The method according to <1> above, wherein the forming the film of the light-transmissive resin material is performed by a spray coating method.

<5> The method according to <1> above, wherein the forming the film of the light-transmissive resin material is performed by an ink-jet method.

<6> The method according to any one of <1> to <5> above, wherein the light-transmissive resin material is a photocurable resin.

<7> The method according to <6> above, wherein the photocurable resin is formed of a radical polymerizable monomer.

<8> The method according to <7> above, wherein the radical polymerizable monomer contains two or more radical polymerizable functional groups.

<9> The method according to <7> above, wherein the radical polymerizable monomer is a monomer containing an ethylenically unsaturated double bond-containing group.

<10> The method according to <9> above, wherein the monomer containing an ethylenically unsaturated double bond-containing group is one of an acrylic acid ester and a methacrylic acid ester.

<11> The method according to any one of <7> to <10> above, wherein the curing the part of the film of the light-transmissive resin material is performed by exposing and radical-polymerizing the radical polymerizable monomer in the presence of a photopolymerization initiator.

<12> The method according to any one of <7> to <11> above, wherein the amount of the radical polymerizable monomer remaining in the optical path length-adjusting layer is $1 \times 10^{-2}$ $g/m^2$ or lower.

<13> The method according to any one of <1> to <12> above, wherein the optical path length-adjusting layer is formed on a planarizing film, and the planarizing film is formed of the same light-transmissive resin material as the light-transmissive resin material of the optical path length-adjusting layer.

<14> The method according to any one of <1> to <5> above, wherein the light-transmissive resin material is a photo-dissolvable resin.

<15> A light-emitting display device including:
a substrate over which a reflective metal and a semi-transparent member are disposed in at least one of a plurality of pixel regions corresponding to red, green and blue, and
an optical path length-adjusting layer formed, on the substrate, of a light-transmissive resin material.

<16> The light-emitting display device according to <15> above, wherein the light-emitting display device is obtained by the method according to any one of <1> to <14> above.

<17> A light-emitting display including: the light-emitting display device according to one of <15> and <16> above.

<18> The light-emitting display according to <17> above, wherein the light-emitting display is used as a flexible display.

Advantageous Effects of Invention

The present invention can provide a method for producing a light-emitting display device containing an optical path length-adjusting layer, the method having a simple production process; a light-emitting display device produced through a simple production process; and a light-emitting display. These can solve the existing problems and achieve the above objects.

Figure 1:
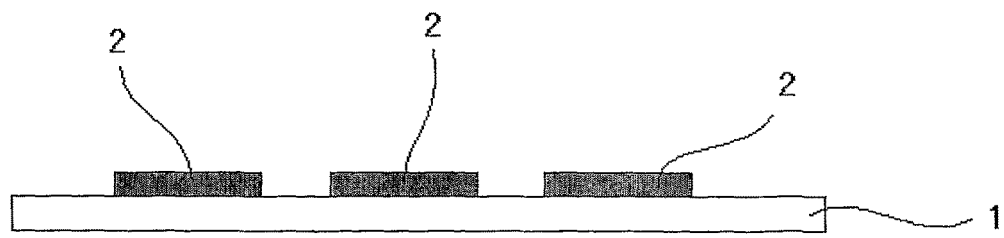
FIG. 1 schematically illustrates a step of a production process for a light-emitting display device of the present invention (part 1).

DESCRIPTION OF EMBODIMENTS (Method for Producing Light-Emitting Display Device)

A method of the present invention for producing a light-emitting display device includes a step of forming a film of a light-transmissive resin material (a light-transmissive resin material film forming step), a step of forming a light-transmissive resin layer (a light-transmissive resin layer forming step), and a step of forming an optical path length-adjusting layer (an optical path length-adjusting layer forming step); and, if necessary, further includes other steps required for producing the light-emitting display device.

<Light-Transmissive Resin Material Film Forming Step>

The light-transmissive resin material film forming step is a step of forming a film of a light-transmissive resin material (a light-transmissive resin material film) on a substrate over which a reflective metal and a semi-transparent member can be disposed in at least one of a plurality of pixel regions corresponding to red, green and blue.

—Light-Transmissive Resin Material—

The light-transmissive resin material is not particularly limited, so long as it has light transmissivity, and may be appropriately selected depending on the purpose. Examples thereof include negative-type resin materials which are cured in the light-transmissive resin layer and positive-type resin materials which are dissolved in the light-transmissive resin layer.

The negative-type resin materials, which are cured in the light-transmissive resin layer, are not particularly limited. Examples thereof include polyesters, acrylic resins, methacrylic resins (in this specification, acrylic resins and methacrylic resins may be collectively referred to as "acrylate polymers"), metacrylic acid-maleic acid copolymers, polystyrens, transparent fluorine-containing resins, polyimides, fluorinated polyimides, polyamides, polyamideimides, polyetherimides, cellulose acylates, polyurethanes, polyether ether ketones, polycarbonates, alicyclic polyolefins, polyarylates, polyethersulfones, polysulfones, fluorene ring-modified polycarbonates, alicyclic-modified polycarbonates, fluorene ring-modified polyesters, acryloyl compounds, polysiloxanes, and other organic silicon compounds. These may be used individually or in combination.

The positive-type resin materials (which are dissolved in the light-transmissive resin layer (photo-dissolvable resins)) are not particularly limited and may be appropriately selected depending on the purpose. Examples thereof include phenol resins commonly used as a positive-type resist, and compositions containing alkali-soluble resins and naphthoquinone diazide-substituted compounds serving as a photosensitizer. Specific examples include diazonaphthoquinone (DNQ)-novolak-type resins such as "novolak-type phenol resin/naphthoquinone diazide-substituted compound" and meta- or para-cresol novolak-type resins such as "novolak-type resin formed of cresol-formaldehyde/trihydroxybenzophenone-1,2-naphthoquinonediazidesulfonic acid ester."

———Photocurable Resin (Radical Polymerizable Monomer)———

Among the above compounds exemplified as the light-transmissive resin material, a photocurable resin is preferred.

The photocurable resin is not particularly limited and is preferably formed of at least one of a radical polymerizable monomer represented by the following General Formula (1) and a radical polymerizable monomer represented by the following General Formula (2).

Each of these radical polymerizable monomers contains two or more radical polymerizable functional groups. Such radical polymerizable monomer, having two or more radical polymerizable functional groups, can be crosslinked three-dimensionally to increase the mechanical strength, which is preferred.

General Formula (1)

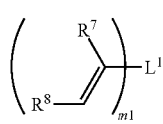

where $R^7$ represents a hydrogen atom or a methyl group, $R^8$ represents a hydrogen atom, $L^1$ represents a C1 to C18 substituted or non-substituted alkylene group, a C1 to C18 substituted or non-substituted arylene group, an ether group, an imino group, a carbonyl group, and a mono- or higher valent linking group in which a plurality of these groups are linearly linked together, and m1 is an integer of 1 to 6, where when m1 is an integer of 2 or greater, $R^7$ and $R^8$ may be identical or different among the repeating units.

General Formula (2)

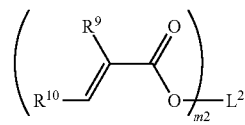

where $R^9$ represents a hydrogen atom or a methyl group, $R^{10}$ represents a hydrogen atom, $L^2$ represents a C1 to C18 substituted or non-substituted alkylene group, a C1 to C18 substituted or non-substituted arylene group, an ether group, an imino group, a carbonyl group, and a mono- or higher valent linking group in which a plurality of these groups are linearly linked together, and m2 is an integer of 1 to 6, where when m2 is an integer of 2 or greater, $R^9$ and $R^{10}$ may be identical or different among the repeating units.

The photocurable resin particularly preferably contains as a main component an acrylate polymer formed of an ethylenically unsaturated double bond-containing radical polymerizable monomer represented by General Formula (2). Here, the term "main component" refers to a component whose amount is the most among polymerizable monomers forming the light-transmissive resin layer deascribed below, and is 80% by mass or more.

Also, the acrylate polymer is, for example, a polymer containing a constituent unit represented by the following General Formula (3).

$(Z-COO)_n-L$  General Formula (3)

where Z represents a group represented by the following General Formula (a) or a double bond-containing group represented by the following General Formula (b) (in these General Formulas (a) and (b), $R^{11}$ and $R^{12}$ each independently represent a hydrogen atom or a methyl group, and the symbol "*" indicates a position at which each group is bonded to the carbonyl group in General Formula (3)) and L represents n-valent linking group, n is an integer of 1 to 6, where when n is an integer of 2 or greater, Zs may be identical or different among the repeating units, with the proviso that at least one Z represents a group represented by the following General Formula (a).

(a)

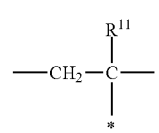

(b)

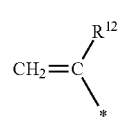

In General Formula (3), the linking group L preferably has 3 to 18 carbon atoms, more preferably 4 to 17 carbon atoms, still more preferably 5 to 16 carbon atoms, particularly preferably 6 to 15 carbon atoms.

When n is an integer of 2, L represents a divalent linking group. Examples of the divalent linking group include alkylene groups (e.g., 1,3-propylene, 2,2-dimethyl-1,3-propylene, 2-butyl-2-ethyl-1,3-propylene, 1,6-hexylene, 1,9-nonylene, 1,12-dodecylene and 1,16-hexadecylene), an ether group, an imino group, a carbonyl group and divalent residues in which a plurality of these divalent groups are linearly linked together (e.g., polyethyleneoxy, polypropyleneoxy, propionyloxyethylene, butyloyloxypropylene, caproyloxyethylene and caproyloxybutylene).

Among them, alklene groups are preferred.

Further, in General Formula (3), the linking group L may have a substituent. Examples of the substituent include alkyl groups (e.g., methyl, ethyl and butyl), aryl groups (e.g., phenyl), amino groups (e.g., amino, methylamino, dimethylamino and diethylamino), alkoxy groups (e.g., methoxy, ethoxy, butoxy and 2-ethylhexyloxy), acyl groups (e.g., acetyl, benzoyl, formyl and pivaloyl), alkoxycarbonyl groups (e.g., methoxycarbonyl and ethoxycarbonyl), a hydroxy group, halogen atoms (e.g., fluorine, chlorine, bromine and iodine) and a cyano group.

In particular, the substituent is preferably a group which does not contain any oxygen-containing functional group, and examples of the group include alkyl groups.

That is, when n is an integer of 2, the linking group L is most preferably an alkylene group which does not contain any oxygen-containing functional group. Use of such a group can further prevent moisture permeation.

In General Formula (3), when n is an integer of 3, L represents a trivalent linking group. Examples of the trivalent linking group include trivalent residues obtained by removing one hydrogen atom from the aforementioned divalent linking groups, and trivalent residues obtained by substituting one hydrogen atom of the aforementioned divalent linking groups with an alkylene group, an ether group, a carbonyl group, or a divalent group in which these groups are linearly linked together. Among them, preferred are trivalent residues which are obtained by removing one hydrogen atom from an alkylene group and which do not contain any oxygen-containing functional group. Use of such a group can further prevent moisture permeation.

In General Formula (3), when n is an integer of 4 or greater, L represents a tetra- or higher valent linking group. Such a tetra- or higher valent linking group is exemplified similar to the above. In addition, preferred ones are exemplified similar to the above. In particular, preferred are tetravalent residues which are obtained by removing two hydrogen atoms from an alkylene group and which do not contain any oxygen-containing functional group. Use of such a group can further prevent moisture permeation.

Furthermore, the polymer may contain a constituent unit which is not represented by General Formula (3). For example, it may contain a constituent unit formed through copolymerization of an acrylate monomer and a methacrylate monomer.

In the polymer, the amount of the constituent unit which is not represented by General Formula (3) is preferably 20% by mass or less, more preferably 15% by mass or less, particularly preferably 10% by mass or less.

Examples of polymers which do not contain a constituent unit represented by General Formula (3) include polyesters, methacrylic acid-maleic acid copolymers, polystyrenes, transparent fluorine-containing resins, polyimides, fluorinated polyimides, polyamides, polyamideimides, polyetherimides, cellulose acylates, polyurethanes, polyether ketones, polycarbonates, alicyclic polyolefins, polyarylates, polyethersulfones, polysulfones, fluorene ring-modified polycarbonates, alicyclic-modified polycarbonates and fluorene ring-modified polyesters.

The following monomers are given as specific examples of the radical polymerizable monomer represented by General Formula (2). In the present invention, the radical polymerizable monomers forming the light-transmissive resin material are not limited thereto.

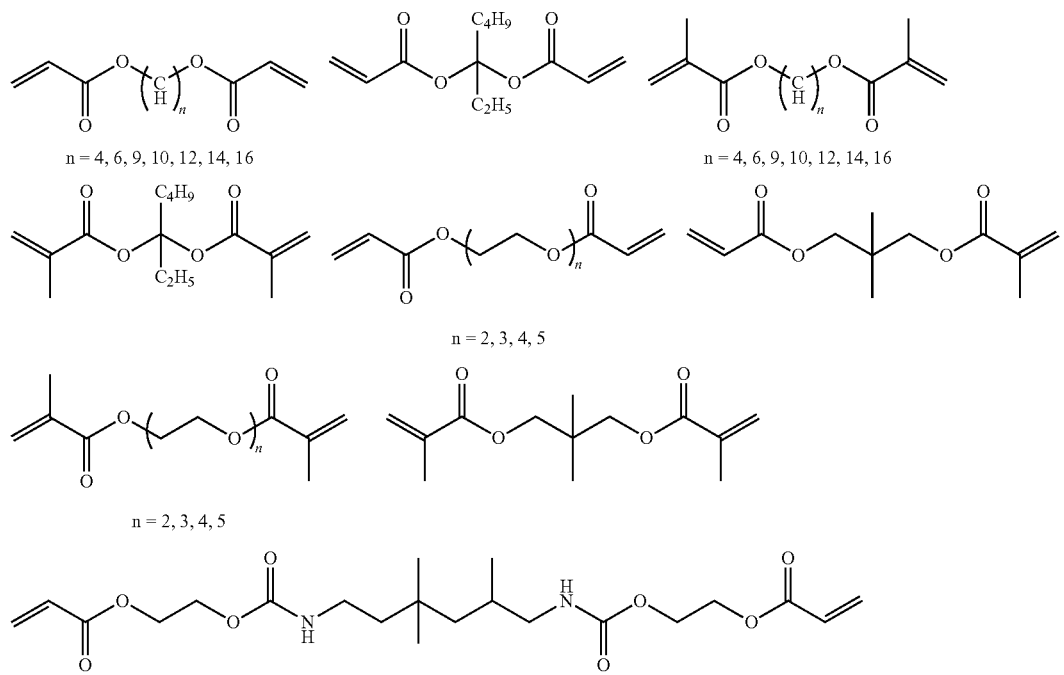

-continued
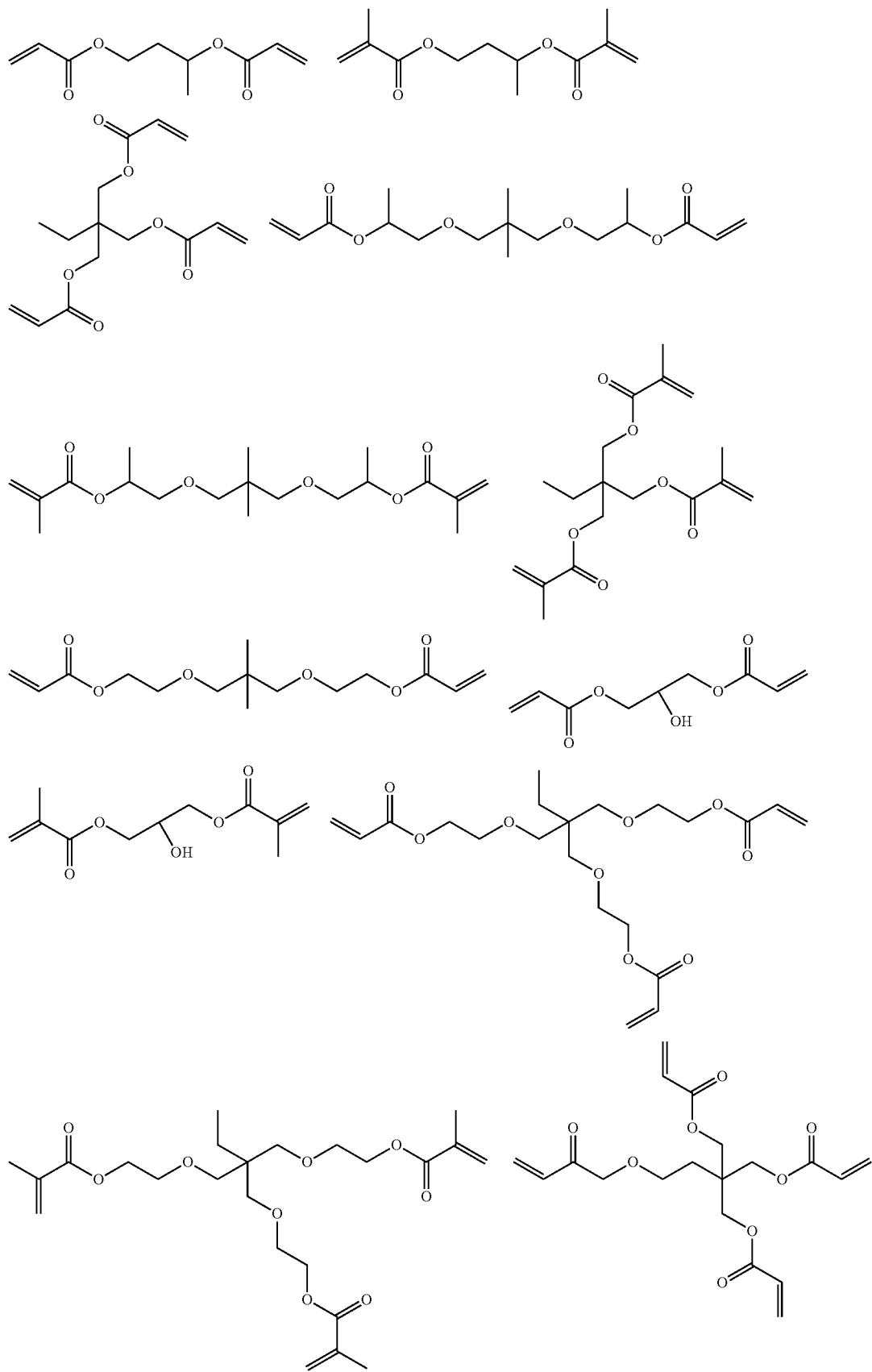

-continued
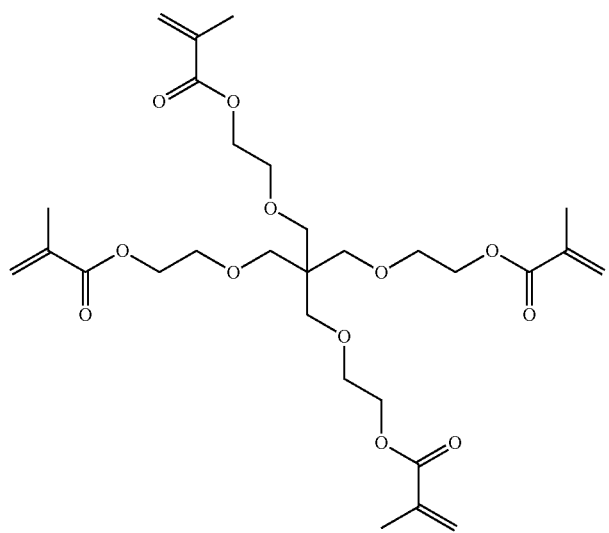
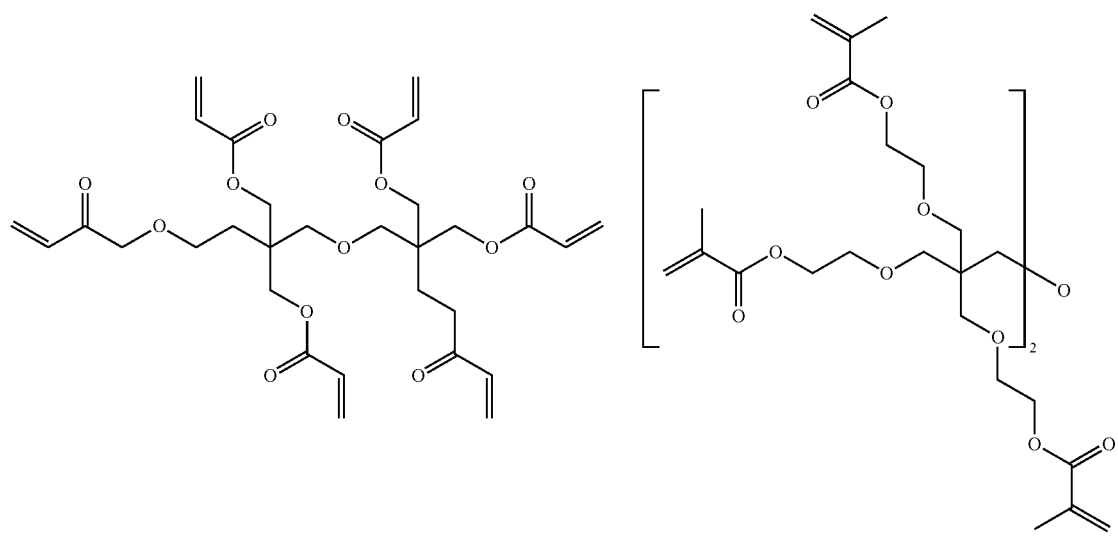
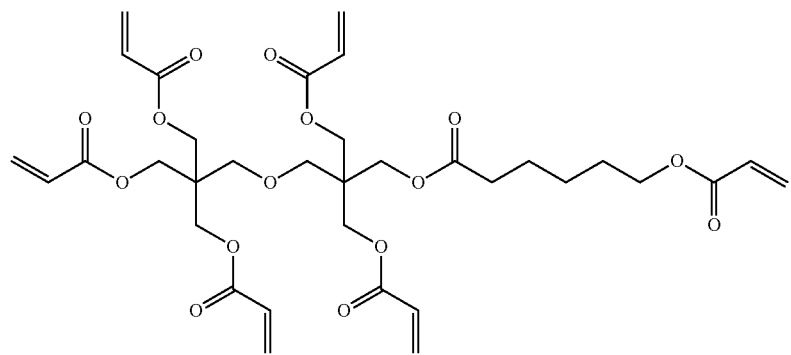

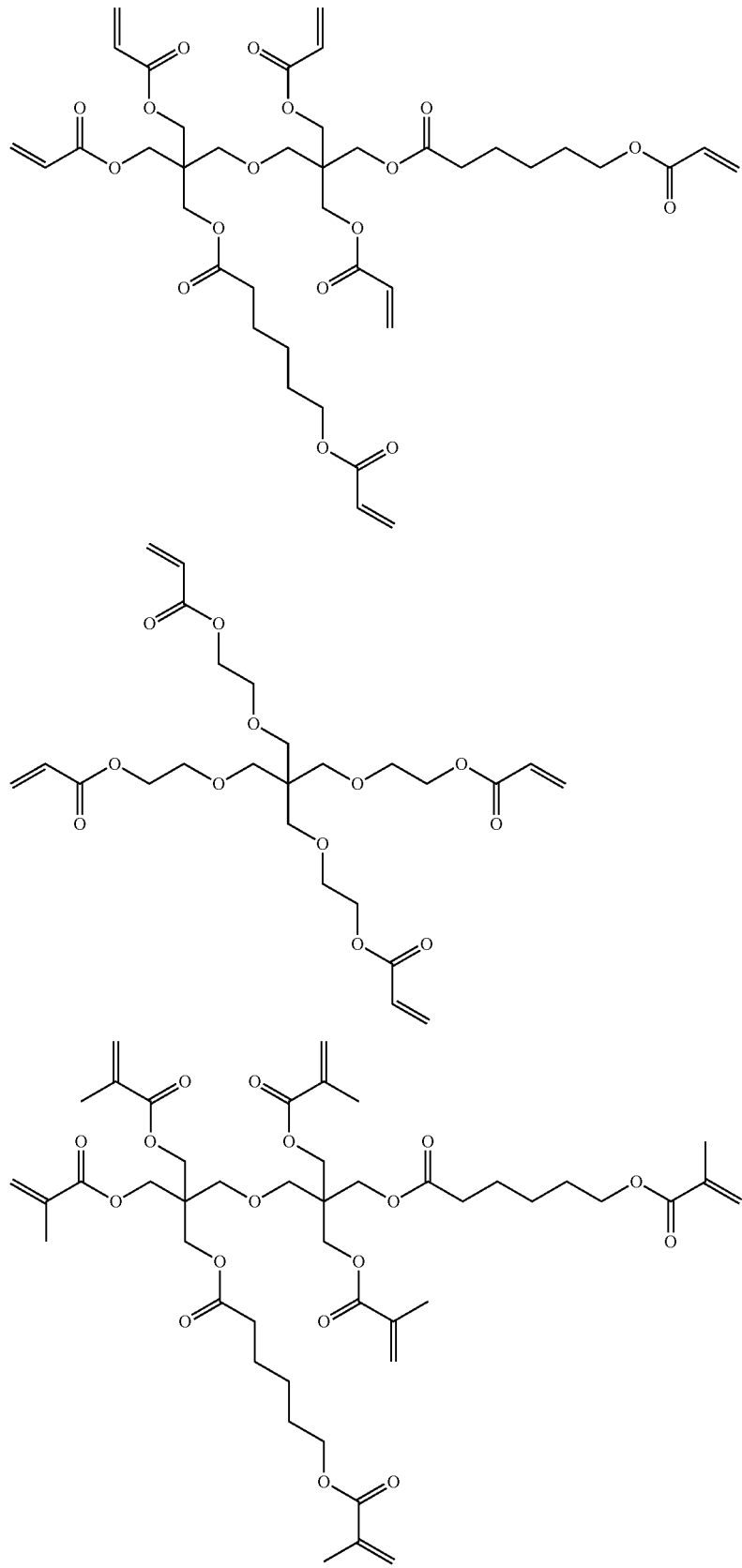

-continued
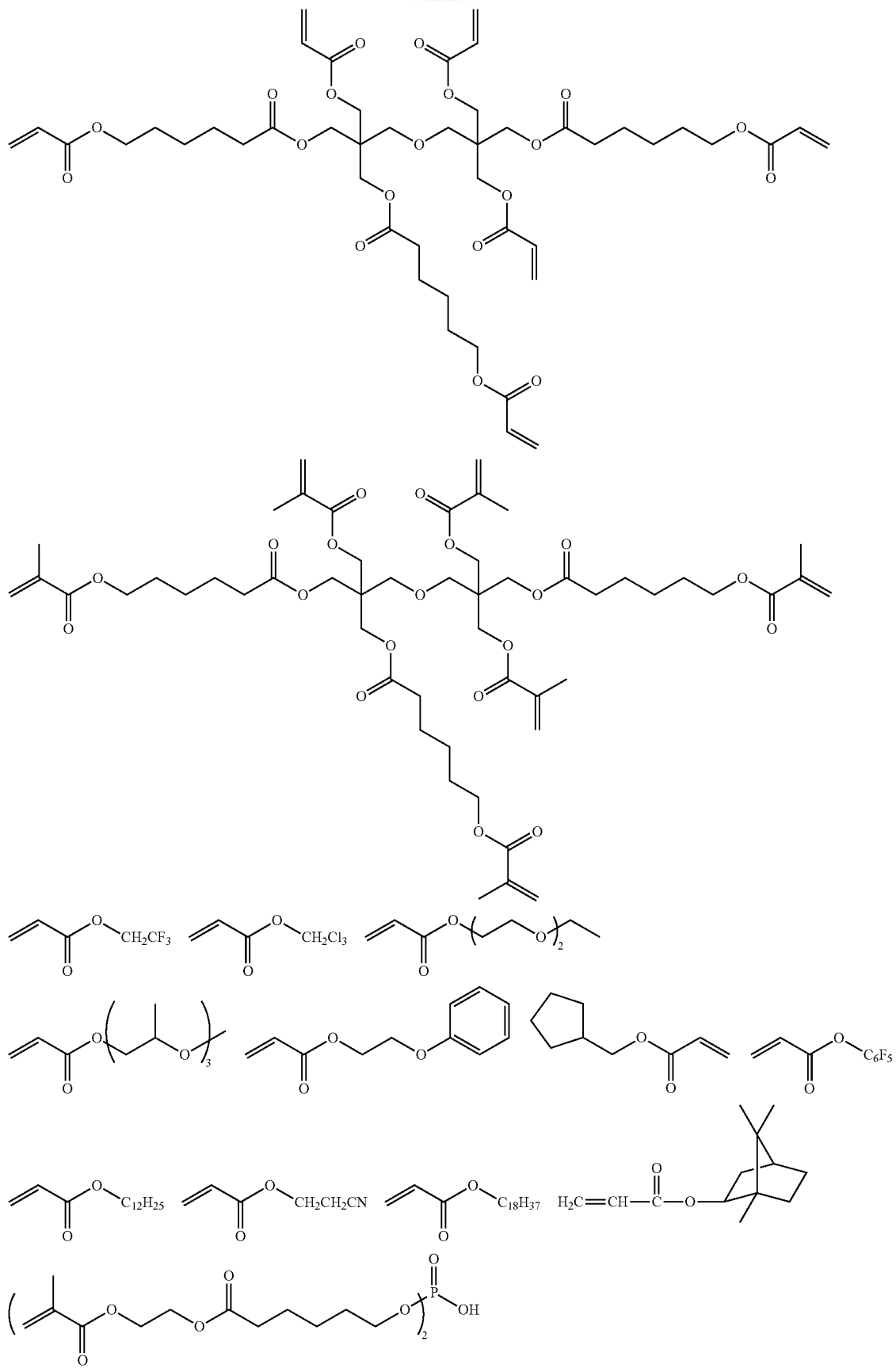

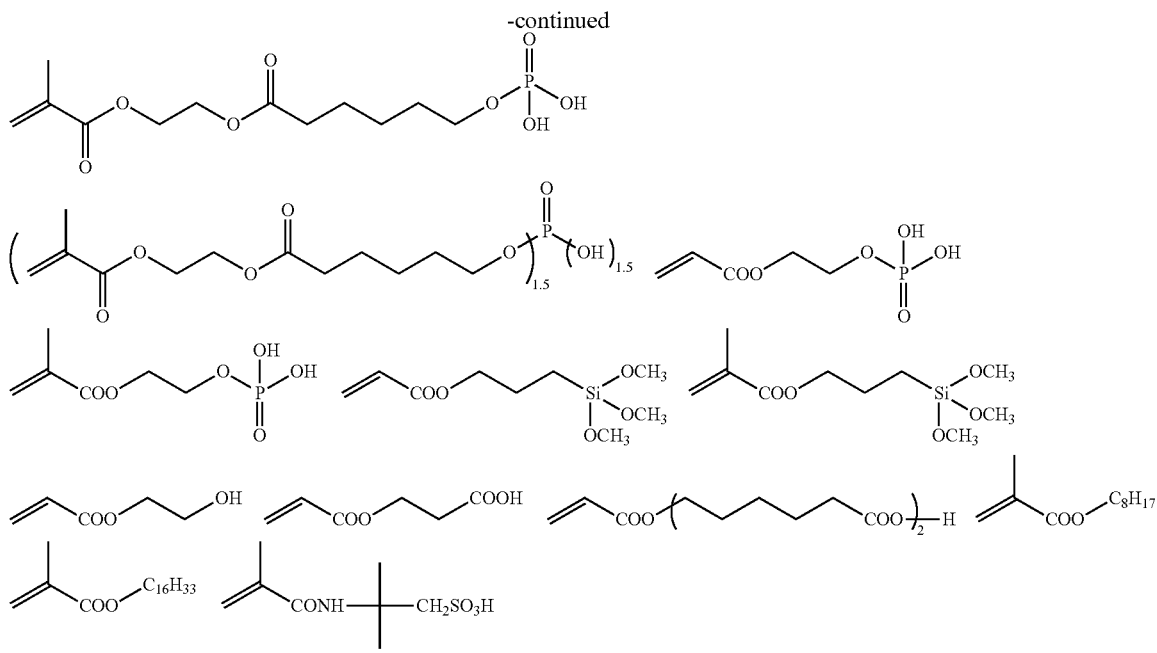

Acid Monomer

The light-transmissive resin material may further contain an acid monomer.

Use of the acid monomer improves the interlayer adhesiveness.

The acid monomer refers to a monomer containing an acid group such as a carboxylic acid group, a sulfonic acid group, a phosphoric acid group and a phosphonic acid group.

As the acid monomer, preferred are monomers containing a carboxylic acid group or a phosphoric acid group. More preferred are (meth)acrylates containing a carboxylic acid group or a phorphoric acid group. Still more preferred are (meth)acrylates containing a phorphoric acid ester group.

———(Meth)acrylate Containing Phorphoric Acid Ester Group———

(Meth)acrylates containing a phorphoric acid ester group preferably contain a compound represented by General Formula (P). Use of (meth)acrylates containing a phosphoric acid ester group improves adhesiveness to an organic layer.

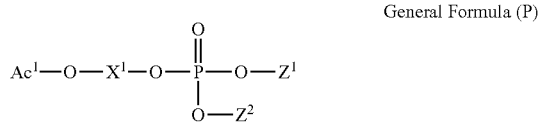

General Formula (P)

where $Z^1$ represents $Ac^2$—O—$X^2$—, a substituent containing no polymerizable group or a hydrogen atom, $Z^2$ represents $Ac^3$—O—$X^3$—, a substituent containing no polymerizable group or a hydrogen atom, each of $Ac^1$, $Ac^2$ and $Ac^3$ represents an acryloyl group or methacryloyl group, and each of $X^1$, $X^2$ and $X^3$ represents a divalent linking group.

Among the compounds represented by General Formula (P), preferred are monofunctional monomers represented by the following General Formula (P-1), difunctional monomers represented by the following General Formula (P-2), and trifunctional monomers represented by the following General Formula (P-3).

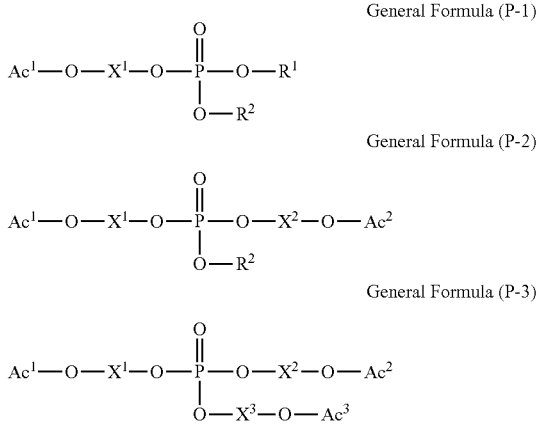

In General Formulas (P-1) to (P-3), $Ac^1$, $Ac^2$, $Ac^3$, $X^1$, $X^2$ and $X^3$ have the same meanings as defined in General Formula (P). In General Formulas (P-1) and (P-2), $R^1$ represents a substituent containing no polymerizable group or a hydrogen atom, and $R^2$ represents a substituent containing no polymerizable group or a hydrogen atom.

In General Formulas (P) and (P-1) to (P-3), each of $X^1$, $X^2$ and $X^3$ is the same group as the group denoted by L1 in General Formula (2). Preferably, each of $X^1$, $X^2$ and $X^3$ is an alykylene group or an alkyleneoxycarbonylalkylene group.

Examples of the substituent containing no polymerizable group in General Formulas (P) and (P-1) to (P-3) include alkyl groups, aryl groups and combinations thereof, with alkyl groups being preferred.

The alkyl group preferably has 1 to 12 carbon atoms, more preferably 1 to 9 carbon atoms, still more preferably 1 to 6 carbon atoms.

Specific examples of the alkyl group include methyl, ethyl, propyl, butyl, pentyl and hexyl.

The alkyl group may be linear, branched or cyclic, with linear alkyl groups being preferred. The alkyl group may have as a substituent an alkoxy group, an aryl group, an aryloxy group, etc.

The aryl group preferably has 6 to 14 carbon atoms, more preferably 6 to 10 carbon atoms.

Specific examples of the aryl group include phenyl, 1-naphthyl and 2-naphthyl.

The aryl group may have a substituent an alkyl group, an alkoxy group, an aryloxy group, etc.

In the present invention, the monomers represented by General Formula (P) may be used individually or in combination. When the monomers are used in combination, two or more of the monofunctional monomers represented by General Formula (P-1), the difunctional monomers represented by General Formula (P-2), and the trifunctional monomers represented by General Formula (P-3) may be used in combination.

In the present invention, as polymerizable monomers containing the phosphoric acid ester group, commercially available compounds (e.g., KAYAMER series (products of NIPPON KAYAKU CO., LTD.) and Phosmer series (products of Uni-Chemical K.K.)) may be directly used, or newly synthesized compounds may be used.

The following monomers are given as non-limitative specific examples of the acid monomer in the present invention.

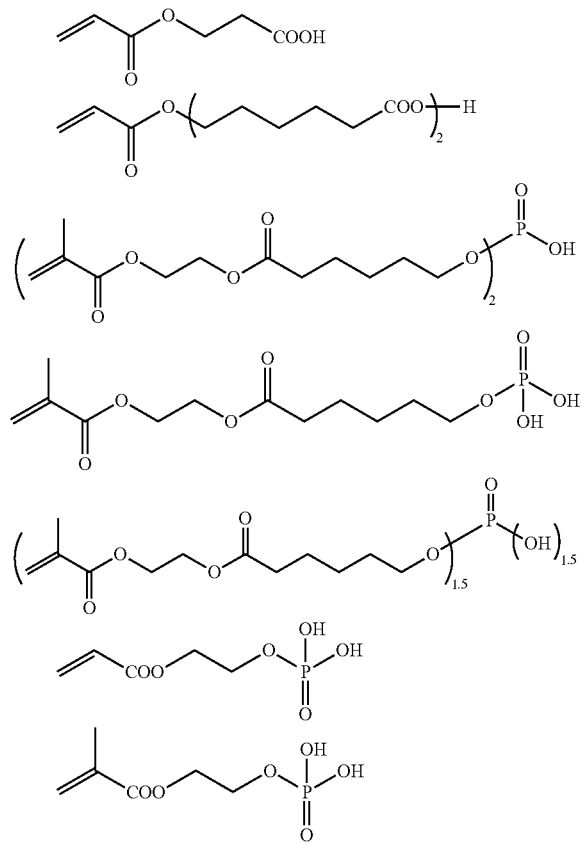

—Substrate—

The substrate is not particularly limited and may be appropriately selected depending on the purpose. For example, preferred are barrier films and glass materials having heat resistance and gas-barrier property.

Specifically, the substrate is preferably formed of a transparent material with high heat resistance which has a glass transition temperature (Tg) of 100° C. or higher and/or a linear thermal expansion coefficient of 40 ppm/° C. or lower. The Tg and linear thermal expansion coefficient can be adjusted using, for example, an additive.

Such resin materials for the substrate are not particularly limited. Examples thereof include polyethylene naphthalate (PEN: 120° C.), polycarbonates (PC: 140° C.), alicyclic polyolefins (e.g., ZEONOR 1600 (product of ZEON Corporation): 160° C.), polyarylates (PAr: 210° C.), polyethersulfones (PES: 220° C.), polysulfones (PSF: 190° C.), cycloolefin copolymers (COC: compounds described in JP-A No. 2001-150584: 162° C.), polyimides (e.g., NEOPRIM (product of MITSUBISHI GAS CHEMICAL COMPANY INC.): 260° C.), fluorene ring-modified polycarbonates (BCF-PC, compounds described in JP-A No. 2000-227603: 225° C.), alicyclic-modified polycarbonates (IP-PC, compounds described in JP-A No. 2000-227603: 205° C.), acryloyl compounds (compounds described in JP-A No. 2002-80616: 300° C. or higher) (the parenthesized temperatures are Tgs of the corresponding materials). In particular, for high transparency, use of alicyclic polyolefin and the like is preferred.

The light transmittance of the substrate is generally 80% or higher, preferably 85% or higher, more preferably 90% or higher.

The light transmittance may be measured according to the method stipulated as JIS-K7105. Specifically, using an integrating sphere-type light transmittance meter, a whole light transmittance and a quantity of scattered light are measured, and the diffusive transmittance is subtracted from the whole transmittance to obtain the intended light transmittance of a sample.

The thickness of the glass material or barrier film is not particularly limited. It is typically 1 μm to 800 μm, preferably 10 μm to 200 μm.

——Reflective Metal and Semi-Transparent Member——

The reflective metal reflects light emitted from an organic light-emitting layer.

The semi-transparent member reflects or transmits light emitted from an organic light-emitting layer.

These reflective metal and semi-transparent member are arranged so as to face each other with an organic light-emitting layer intervening therebetween, and resonate light emitted from the organic light-emitting layer.

The semi-transparent member is not particularly limited and may be appropriately selected depending on the purpose. For example, preferred are a semi-transparent metal, a semi-transparent dielectric multilayer mirror and a combination thereof.

The semi-transparent metal is not particularly limited and may be formed as the below-described anode.

The semi-transparent dielectric multilayer mirror is not particularly limited. Examples thereof include a mirror of a dielectric multilayer film made of, for example, a laminate of $SiO_2$ and SiN.

The reflective metal is not particularly limited and may be formed as the below-described cathode.

—Film Formation—

The method for forming a film of the light-transmissive resin material is not particularly limited and may be appropriately selected depending on the purpose. Examples thereof include a vapor-phase film forming method and a coating film forming method. From the viewpoint of simplification of the production process, a vapor-phase film forming method is preferred.

The vapor-phase film forming method is not particularly limited and may be appropriately selected depending on the purpose. Preferred are a flash evaporation method and a spray coating method.

When a coating film forming method is employed, a solution prepared by dissolving the light-transmissive resin material in a solvent is applied by, for example, a spin coating method to form a film. In this case, the thickness of the film may be difficult to control due to variation in flatness in structures of a panel (e.g., TFT circuit elements arranged on a substrate). As a result, a desired optical path length difference cannot be formed in some cases.

In contrast, when a vapor-phase film forming method is employed, a film of the light-transmissive resin material can be formed not depending on variation in flatness in structures of a panel.

The film forming conditions for the flash evaporation method are not particularly limited. For example, preferably, the heating temperature for the monomer is 100° C. to 200° C. and the vacuum degree is about $1 \times 10^{-2}$ Pa to about 10 Pa.

<Light-Transmissive Resin Layer Forming Step>

The light-transmissive resin layer forming step is a step of curing part of the light-transmissive resin material film to form a light-transmissive resin layer, the part being in a region including the at least one pixel region.

—Curing Reaction—

The reaction for curing the light-transmissive resin material is not particularly limited and may be appropriately selected depending on the purpose. Examples thereof include thermal polymerization, photopolymerization (by UV rays or visible rays), electron beam polymerization, plasma polymerization and combinations thereof.

In particular, radical polymerizable monomers are preferably radical-polymerized through exposure to light in the presence of a photopolymerization initiator.

The light used in the photopolymerization is generally UV rays emitted from a high-pressure mercury lamp or a low-pressure mercury lamp.

The irradiation energy is preferably 0.5 J/cm$^2$ or higher, more preferably 2 J/cm$^2$ or higher.

When (meth)acrylic acid esters are used as the radical polymerizable monomer, the oxygen concentration or oxygen partial pressure during polymerization is preferably decreased, since the polymerization thereof is inhibited by oxygen contained in air.

In order to attain such polymerization conditions, for example, inert gas substitution methods (e.g., a nitrogen substitution method and an argon substitution method) and pressure reduction methods. In particular, curing under reduced pressure is preferred since the concentration of dissolved oxygen in the monomer is decreased.

When the oxygen concentration during polymerization is decreased by a nitrogen substitution method, the oxygen concentration is preferably 2% or lower, more preferably 0.5% or lower. When the oxygen partial pressure during polymerization is decreased by a pressure reduction method, the total pressure is preferably 1,000 Pa or lower, more preferably 100 Pa or lower.

Particularly preferably, the monomers are polymerized through irradiation of UV rays at a reduced pressure of 100 Pa or lower and at 2 J/cm$^2$ or higher.

Most preferably, a film of the radical polymerizable monomer, which has been formed by a flash evaporation method, is subjected to polymerization under reduced pressure through application of energy of 2 J/cm$^2$ or higher. When the polymerization is performed in this manner, the polymerization degree can be increased to obtain an organic layer having a high hardness. The polymerization of the radical polymerizable monomer is preferably performed after a mixture of the monomer has been applied to an intended place through vapor deposition.

The polymerization degree of the radical polymerizable monomer is preferably 85% or higher, more preferably 88% or higher, still more preferably 90% or higher, particularly preferably 92% or higher. Here, the term "polymerization degree" refers to a rate of the reacted polymerizable groups in all the polymerizable groups (acryloyl groups and methacryloyl groups) contained in the monomer mixture. The polymerization degree can be measured by an infrared absorption method.

——Photopolymerization Initiator——

The photopolymerization initiator is not particularly limited, so long as it may be a compound which generates radicals upon irradiation of light. Preferred are those which can be used in a vapor-phase film forming method. In particular, when a flash evaporation method (one-vapor-phase film forming method) is employed for film formation, preferred is a photopolymerization initiator which has a melting point of 30° C. or lower or which is in a liquid state under 1 atm and at 30° C. Here, the term "melting point" refers to a temperature at which the state of a photopolymerization initiator changes from a solid state to a liquid state. Also, the expression "in a liquid state" means that, when a container containing a photopolymerization initiator under 1 atm and at 30° C. is tilted, the photopolymerization initiator exhibits flowability.

One photopolymerization initiator may be used, or two or more photopolymerization initiators may be used in combination. For example, when two photopolymerization initiators are used in combination, a photopolymerization initiator which is in a liquid state is preferably used.

Such a photopolymerization initiator becomes in a liquid state when an organic layer is actually formed through vacuum vapor deposition, even a small amount of the photopolymerization initiator can satisfactorily cure the radical polymerizable monomer.

The light-transmissive resin layer stably produced in this manner releases to a less extent gas derived from the residual radical polymerizable monomer. As a result, damage to adjacent layers thereto can be reduced.

In the present invention, the amount of the radical polymerizable monomer remaining in the light-transmissive resin material (the bellow-described optical path length-adjusting layer) is preferably $1 \times 10^{-2}$ g/m$^2$ or lower, more preferably $1 \times 10^{-4}$ g/m$^2$ or lower.

The molecular weight of the photopolymerization initiator is 170 or higher, more preferably 190 or higher. The photopolymerization initiator having a molecular weight falling within the above range volatiles to a less extent and as a result, a stably cured light-transmissive resin layer can be easily obtained. Notably, the upper limit of the molecular weight of the photopolymerization initiator is not particularly defined, but the molecular weight thereof is generally 1,000 or lower.

The amount of the polymerization initiator added is preferably 10% by mass or less, more preferably 5% by mass or less, still more preferably 2% by mass or less, particularly preferably 1% by mass or less, with respect to that of the light-transmissive resin material as a composition for forming the light-transmissive resin layer.

When the light-transmissive resin material film is formed by the vapor-phase film forming method, a less amount of the photopolymerization initiator added can sufficiently initiate the reaction of the radical polymerizable monomers, as compared with the case where the light-transmissive resin material film is formed by coating a solution dissolved by the light-transmissive resin material in a solvent. Thus, the amount of the photopolymerization initiator added can be decreased.

By decreasing the amount of the photopolymerization initiator added, the amount of the photopolymerization initiator remaining in the light-transmissive resin layer (optical path length-adjusting layer) can also be decreased. As a result, the amount of gas derived from the photopolymerization initiator can be decreased to reduce damage to adjacent layers thereto.

The photopolymerization initiator is not particularly limited. When the vapor-phase film forming method is employed, a compound represented by the following General Formulas (4) or (5) is preferred.

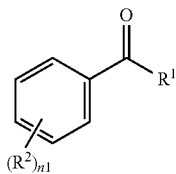

General Formula (4)

where $R^1$ represents a C1 to C18 substituted or non-substituted alkyl group, a C1 to C18 substituted or non-substituted aryl group, a carbonyl group or a substituent in which a plurality of these groups are linearly linked together, $R^2$ represents a C1 to C18 substituted or non-substituted alkyl group, a C1 to C18 substituted or non-substituted aryl group, an amino group, an alkoxy group, an acyl group, an alkoxycarbonyl group, an alkylthio group, an arylthio group, a hydroxy group, a halogen atom or a cyano group, and n1 is an integer of 0 to 5, where when n1 is an integer of 2 or greater, $R^2$s may be identical or different among the repeating units.

Here, $R^1$ is preferably a C1 to C18 substituted or non-substituted alkyl group or a C1 to C18 substituted or non-substituted aryl group, and $R^2$ is preferably a C1 to C18 substituted or non-substituted alkyl group. When $R^1$ is a C1 to C18 substituted alkyl group, the substituted alkyl group preferably has, as a substituent, an alkoxy group, a hydroxyl group or an amino group at the carbon atom at which it is linked to the carbonyl group. n1 is preferably an integer of 0 to 3.

As such compounds, commercially available products such as DAROCURE 1173 (product of Ciba Specialty Chemicals) can be employed.

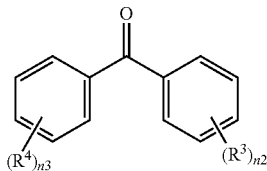

General Formula (5)

where $R^3$ represents a C1 to C18 substituted or non-substituted alkyl group, a C1 to C18 substituted or non-substituted aryl group, an amino group, an alkoxy group, an acyl group, an alkoxycarbonyl group, an alkylthio group, an arylthio group, a hydroxy group, a halogen atom or a cyano group, $R^4$ represents a C1 to C18 substituted or non-substituted alkyl group, a C1 to C18 substituted or non-substituted aryl group, an amino group, an alkoxy group, an acyl group, an alkoxycarbonyl group, an alkylthio group, an arylthio group, a hydroxy group, a halogen atom or a cyano group, and each of n2 and n3 is an integer of 0 to 5, with the case where both of n2 and n3 are 0 being excluded, where when n2 is an integer of 2 or greater, $R^3$s may be identical or different among the repeating units, and when n3 is an integer of 2 or greater, $R^4$s may be identical or different among the repeating units.

$R^3$ is preferably a C1 to C18 substituted or non-substituted alkyl group, and $R^4$ is preferably a C1 to C18 substituted or non-substituted alkyl group. Preferably, n2 is an integer of 0 to 3 and n3 is an integer of 0 to 3.

Examples of such compounds include 2-methylbenzophenone, and commercially available products such as EZACURE TZT (product of Lamberti) can be employed.

<Optical Path Length-Adjusting Layer Forming step>

The optical path length-adjusting layer forming step is a step of developing the light-transmissive resin layer cured through curing reaction to form an optical path length-adjusting layer.

—Development—

The developing method is not particularly limited and may be appropriately selected depending on the purpose. Examples thereof include ultrasonic development using an organic solvent such as isopropyl alcohol, acetone or toluene.

Optical Path Length-Adjusting Layer

The light-emitting display device of the present invention has a resonance structure in which the optical path length-adjusting layer is formed inside at least one of red, green and blue pixel regions.

The thickness of the optical path length-adjusting layer is adjusted so that each sub pixel has such an optical distance (optical path length) that light having a predetermined wavelength can be resonated efficiently.

Thus, the optical distance, at which light is resonated, is determined depending on the refractive index of a material between a light-reflective film and a light-semi-transparent reflective film and on the composition and thickness thereof, and thus, is not determined by the optical path length-adjusting layer. Considering a commonly employed structure of an organic EL light-emitting layer, in the red pixel region, the thickness (physical thickness) of the optical path length-adjusting layer is preferably 30 nm to 1,000 nm, more preferably 150 nm to 350 nm, particularly preferably 200 nm to 250 nm.

In the green pixel region, the thickness (physical thickness) of the optical path length-adjusting layer is preferably 5 nm to 800 nm, more preferably 100 nm to 250 nm, particularly preferably 150 nm to 200 nm.

In the blue pixel region, the thickness (physical thickness) of the optical path length-adjusting layer is preferably 0 nm to 600 nm, more preferably 50 nm to 200 nm, particularly preferably 100 nm to 150 nm.

The optical path length-adjusting layer may be directly disposed on the top surface of the reflective metal or the semi-transparent member which is disposed on the substrate. In order to dispose the optical path length-adjusting layer so as to planarize the top surface of the reflective metal or the semi-transparent member, a planarizing film for planarizing the top surface is disposed on the top surface thereof, and then the optical path length-adjusting layer may be disposed on the planarizing film.

The planarizing film is not particularly limited but is preferably formed of the same light-transmissive resin material as described above.

<Other Steps>

Examples of other steps include a step of forming an organic electroluminescence element necessary for a light-emitting display device. Next will be described an organic electroluminescence element in the present invention.

—Organic Electroluminescence Element—

The organic electroluminescence element contains a pair of electrodes (i.e., an anode and a cathode) and a light-emitting layer between the electrodes. Examples of functional layers other than the light-emitting layer which are disposed between both the electrodes include a hole transport layer, an electron transport layer, a hole blocking layer, an electron blocking layer, a hole injection layer and an electron injection layer.

The organic electroluminescence element preferably contains the hole transport layer between the anode and the light-emitting layer and contains the electron transport layer between the cathode and the light-emitting layer. In addition, the hole injection layer may be provided between the hole transport layer and the anode, and the electron injection layer may be provided between the electron transport layer and the cathode.

Furthermore, a hole transportable intermediate layer (an electron blocking layer) may be provided between the light-emitting layer and the hole transport layer, and an electron transportable intermediate layer (a hole blocking layer) may be provided between the light-emitting layer and the electron transport layer. Each functional layer may be composed of a plurality of secondary layers.

These functional layers including the light-emitting layer can be suitably formed in accordance with any of a dry film-forming method (e.g., a vapor deposition method and a sputtering method), a wet coating method, a transfer method, a printing method and an ink-jet method.

——Light-Emitting Layer——

The light-emitting layer in the present invention is a layer having the function of receiving holes from the anode, the hole-injection layer, or the hole-transport layer, receiving electrons from the cathode, the electron-injection layer, or the electron-transport layer, and providing a field for recombination of the holes with the electrons for light emission, when an electric field is applied.

The light-emitting layer in the present invention contains a light-emitting material. The light-emitting layer may be composed only of a light-emitting material, or may be a layer formed form a mixture of a host material and a light-emitting material (in the latter case, the light-emitting material may be referred to as a "light-emitting dopant" or "dopant"). The light-emitting material may be a fluorescent light-emitting material, a phosphorescent light-emitting material, or a mixture of two or more materials. The host material is preferably a charge transport material. One or more host materials may be used in the light-emitting layer. Further, a material which does not emit light nor transport any charge may be contained in the light-emitting layer.

The thickness of the light-emitting layer is not particularly limited. In general, it is preferably 2 nm to 500 nm. From the viewpoint of external light-emitting efficiency, the thickness is more preferably 3 nm to 200 nm, still more preferably 5 nm to 100 nm. The light-emitting layer may be a single layer or two or more layers. When it is two or more layers, the layers may emit lights of different colors.

——Light-Emitting Material——

The light-emitting material suitably used in the present invention is, for example, a phosphorescent light-emitting material and a fluorescent light-emitting material. From the viewpoint of drive durability, it is preferred that the light-emitting dopant in the present invention is those satisfying the following relation(s) with respect to the above-described host compound: i.e., 1.2 eV> difference in ionization potential ($\Delta Ip$)>0.2 eV and/or 1.2 eV> difference in electron affinity ($\Delta Ea$)>0.2 eV.

The light-emitting dopant is generally contained in the light-emitting layer in an amount of 0.1% by mass to 50% by mass with respect to the total amount of the compounds forming the light-emitting layer. From the viewpoints of durability and external light-emitting efficiency, it is preferably contained in an amount of 1% by mass to 50% by mass, more preferably 2% by mass to 40% by mass.

<Phosphorescent Light-Emitting Material>

In general, the phosphorescent light-emitting material is, for example, complexes containing a transition metal atom or a lanthanoid atom.

The transition metal atom is not particularly limited. Preferred are ruthenium, rhodium, palladium, tungsten, rhenium, osmium, iridium, gold, silver, copper and platinum. More preferred are rhenium, iridium and platinum. Still more preferred are iridium and platinum.

Examples of ligands in the complexes include those described in, for example, "Comprehensive Coordination Chemistry" authored by G. Wilkinson et al., published by Pergamon Press Company in 1987; "Photochemistry and Photophysics of Coordination Compounds" authored by H. Yersin, published by Springer-Verlag Company in 1987; and "YUHKI KINZOKU KAGAKU—KISO TO OUYOU—(Metalorganic Chemistry—Fundamental and Application—)" authored by Akio Yamamoto, published by Shokabo Publishing Co., Ltd. in 1982.

The above-described complexes may be a complex containing one transition metal atom in the compound, or a so-called polynuclear complex containing two or more transition metal atoms. In the latter case, the complexes may contain different metal atoms at the same time.

Specific examples of the phosphorescent light-emitting material include phosphorescent light-emitting compounds described in patent literatures such as U.S. Pat. Nos. 6,303,238B1, 6,097,147, WO00/57676, WO00/70655, WO1/08230, WO01/39234A2, WO01/41512A1, WO02/02714A2, WO02/15645A1, WO02/44189A1, WO05/19373A2, WO2004/108857A1, WO2005/042444A2, WO2005/042550A1, JP-A Nos. 2001-247859, 2002-302671, 2002-117978, 2003-133074, 2002-235076, 2003-123982 and 2002-170684, EP1211257, and JP-A Nos. 2002-226495, 2002-234894, 2001-247859, 2001-298470, 2002-173674, 2002-203678, 2002-203679, 2004-357791, 2006-93542, 2006-261623, 2006-256999, 2007-19462, 2007-84635 and 2007-96259. Among them, Ir complexes, Pt complexes, Cu complexes, Re complexes, W complexes, Rh complexes, Ru complexes, Pd complexes, Os complexes, Eu complexes, Tb complexes, Gd complexes, Dy complexes and Ce complexes are more preferred, with Ir complexes, Pt complexes and Re complexes being particularly preferred. Among them, Ir complexes, Pt complexes, and Re complexes each containing at least one coordination mode of metal-carbon bonds, metal-nitrogen bonds, metal-oxygen bonds and metal-sulfur bonds are preferred. Furthermore, Ir complexes, Pt complexes, and Re complexes each containing a tri-dentate or higher poly-dentate ligand are particularly preferred from the viewpoints of, for example, light-emission efficiency, drive durability and chromaticity.
The following compounds are given as non-limitative examples of the phosphorescent light-emitting material employable in the present invention.
D-1
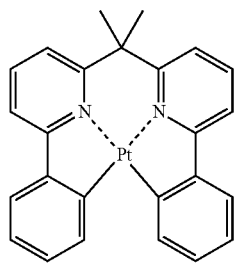
D-2
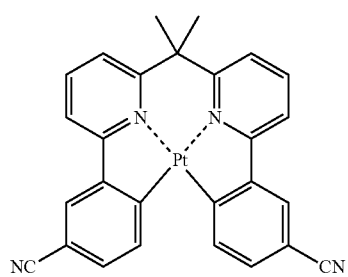
D-3
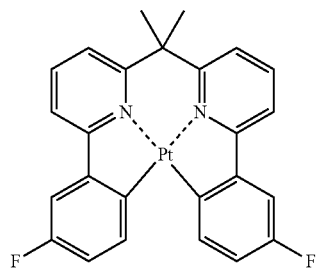
D-4
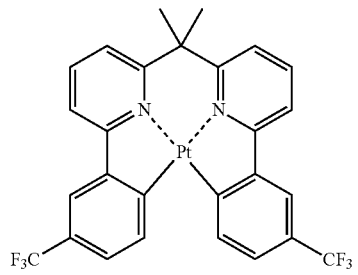
D-5
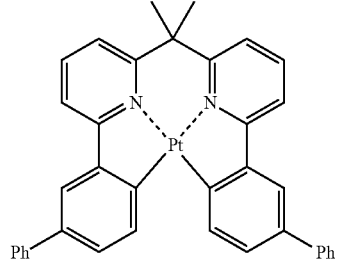
D-6
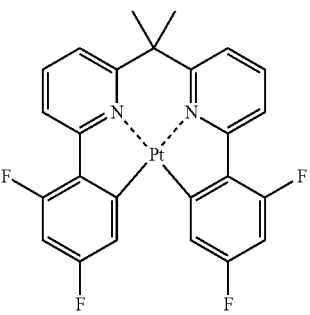
D-7
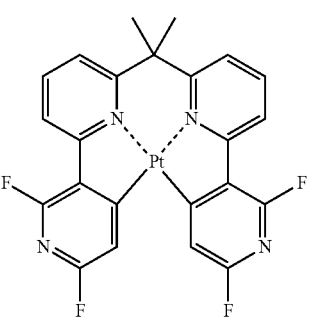
D-8
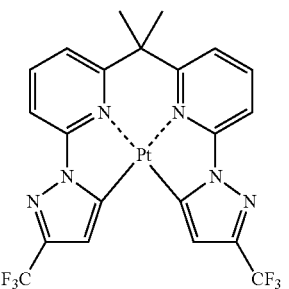
D-9
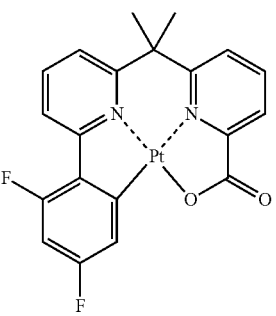
D-10
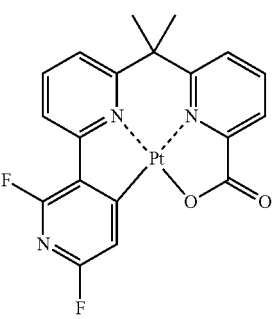

-continued
D-11 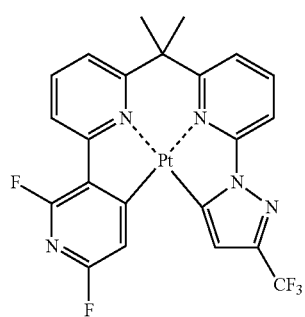
D-12 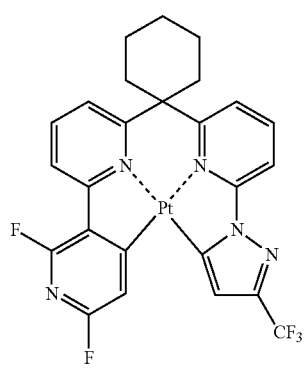
D-13 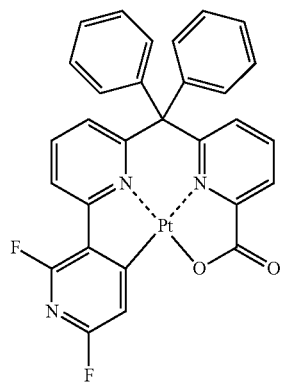
D-14 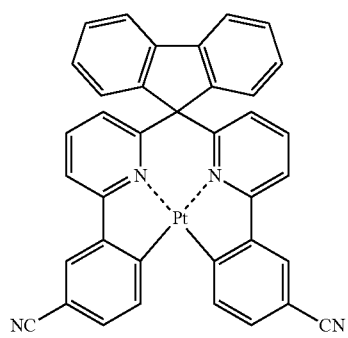
-continued
D-15 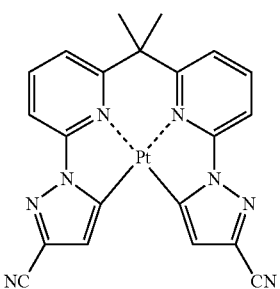
D-16 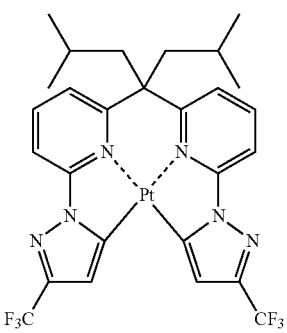
D-17 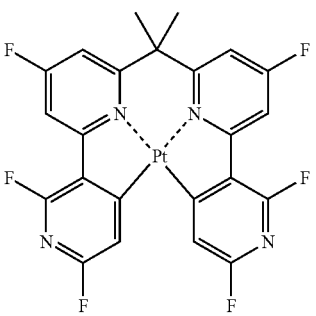
D-18 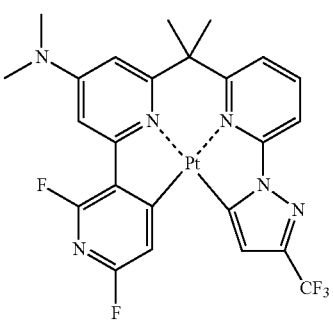
D-19 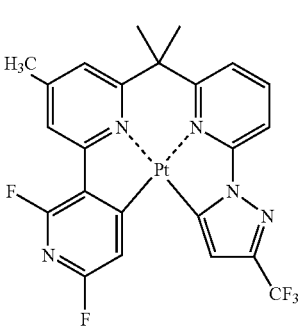

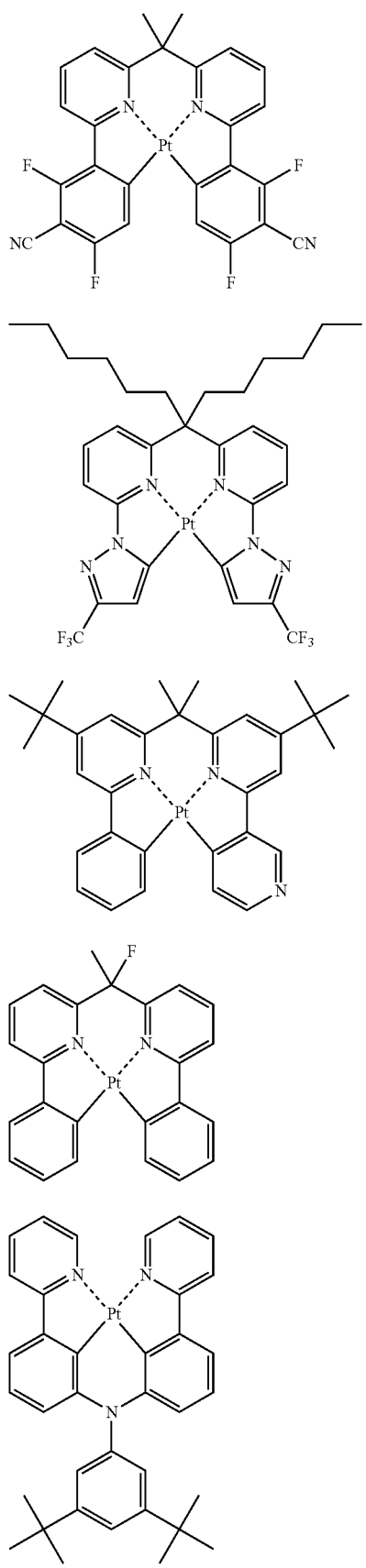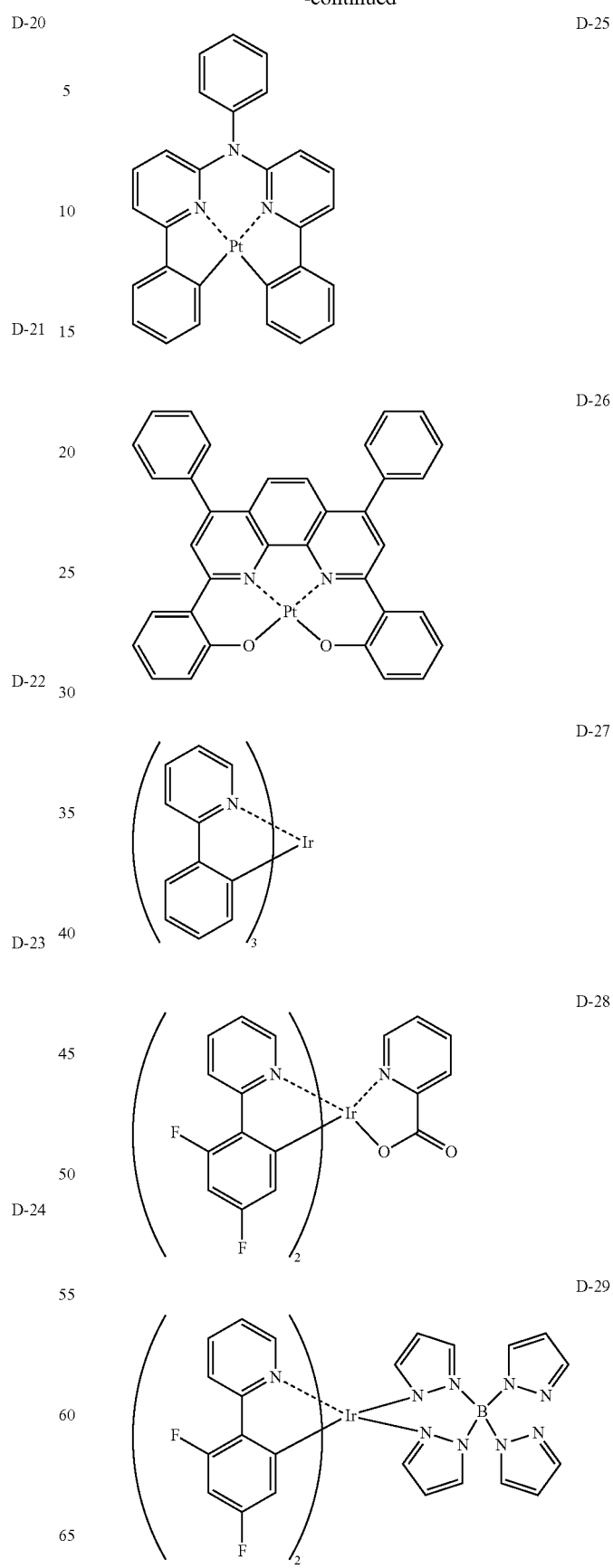

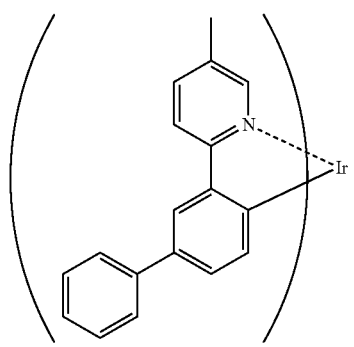 D-30

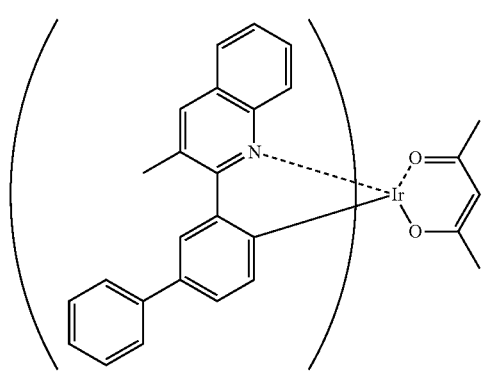 D-31

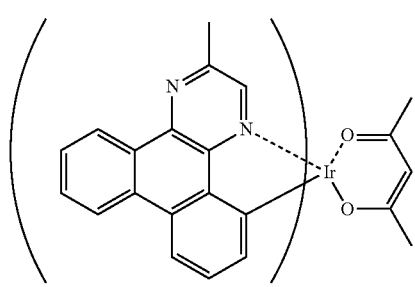 D-32

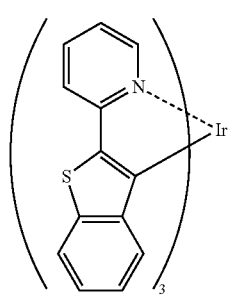 D-33

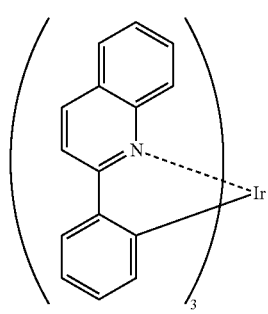 D-34

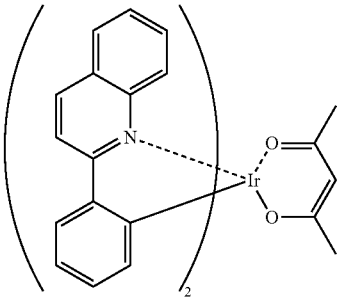 D-35

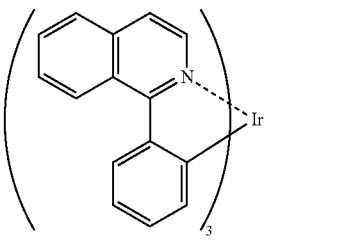 D-36

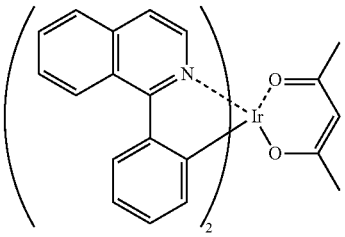 D-37

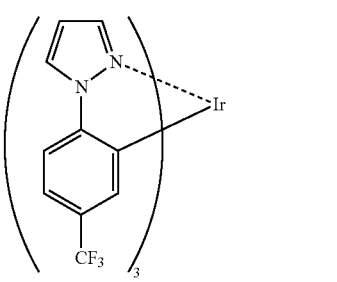 D-38

<Fluorescent Light-Emitting Material>

In general, the fluorescent light-emitting material is, for example, benzoxazole, benzoimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, bis-styrylanthracene, quinacridone, pyrrolopyridine, thiadiazolopyridine, cyclopentadiene, styrylamine, aromatic dimethylidene compounds, condensed polyaromatic compounds (e.g., anthracene, phenanthroline, pyrene, perylene, rubrene and pentacene), various metal complexes (e.g., metal complexes of 8-quinolynol, pyromethene complexes and rare-earth complexes), polymer compounds (e.g., polythiophene, polyphenylene and polyphenylenevinylene), organic silanes and derivatives thereof.

———Host Material———

The host material used in the light-emitting layer may be a hole-transporting host material excellent in hole transportability (hereinafter referred to as a "hole-transporting host") or an electron-transporting host compound excellent in electron transportability (hereinafter referred to as an "electron-transporting host").

<Hole-Transporting Host>

Examples of the hole-transporting host used in the light-emitting layer include the following materials: pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, conductive high-molecular-weight oligomers (e.g., thiophene oligomers and polythiophenes), organic silanes, carbon films and derivatives thereof.

Among them, indole derivatives, carbazole derivatives, aromatic tertiary amine compounds and thiophene derivatives are preferred. Also, compounds each containing a carbazole group in the molecule are more preferred. Further, compounds each containing a t-butyl-substituted carbazole group are particularly preferred.

<Electron-Transporting Host>

Examples of the electron-transporting host material used in the light-emitting layer include the following materials: pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyradine, fluorine-substituted aromatic compounds, heterocyclic tetracarboxylic anhydrides (e.g., naphthalene and perylene), phthalocyanine, derivatives thereof (which may form a condensed ring with another ring) and various metal complexes such as metal complexes of 8-quinolynol derivatives, metal phthalocyanine, and metal complexes having benzoxazole or benzothiazole as a ligand. Among them, metal complexes are preferred in terms of durability. As the metal complexes, preferred are those containing a ligand which has at least one nitrogen atom, oxygen atom, or sulfur atom and which is coordinated with the metal. Examples of the metal complexes (electron-transporting hosts) include compounds described in, for example, JP-A Nos. 2002-235076, 2004-214179, 2004-221062, 2004-221065, 2004-221068 and 2004-327313.

The following compounds are given as non-limitative specific examples of the hole-transporting host material and electron-transporting host material employable in the present invention.

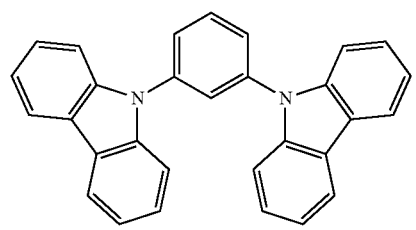

H-1

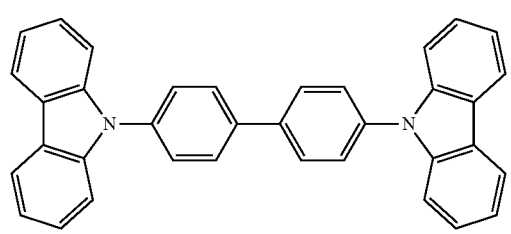

H-2

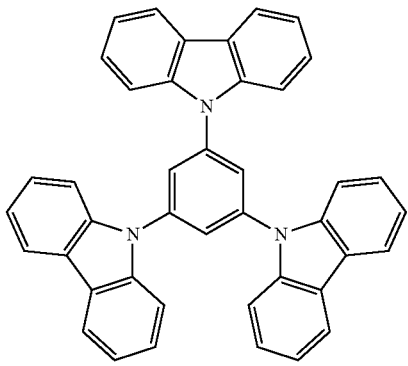

H-3

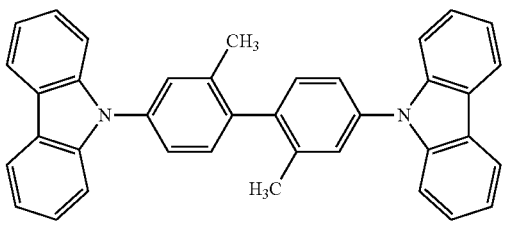

H-4

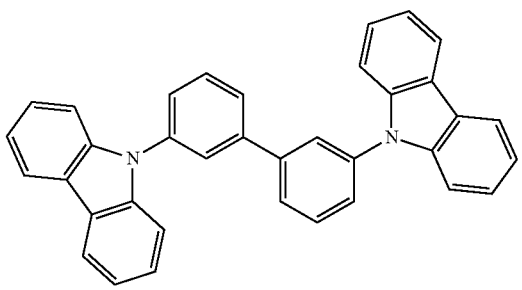

H-5

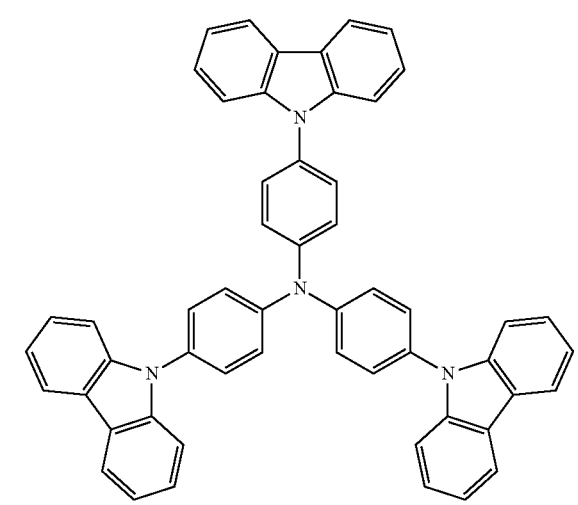

H-6

H-7
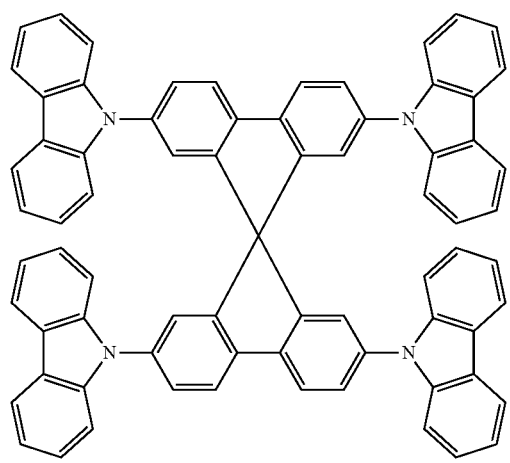
H-8
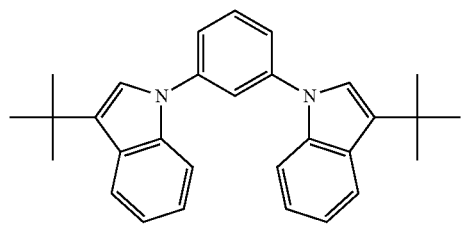
H-9
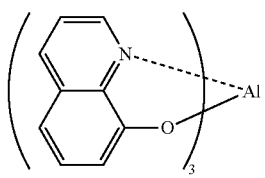
H-10
H-11
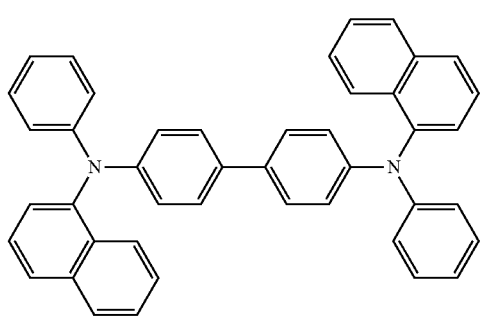
H-12
H-13
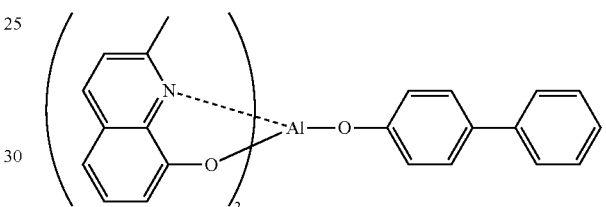
H-14
H-15
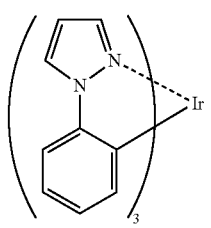
H-16
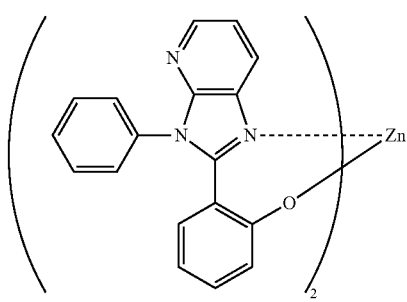

-continued

H-17
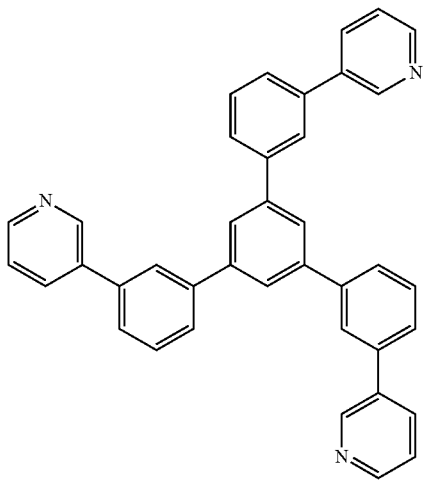

H-18
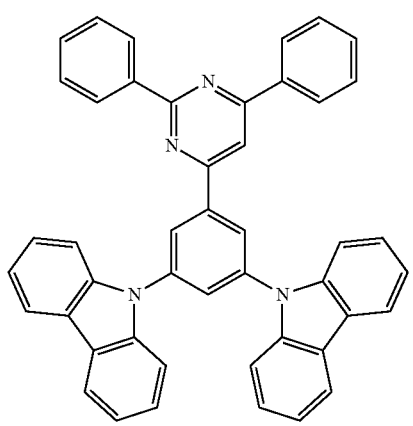

H-19
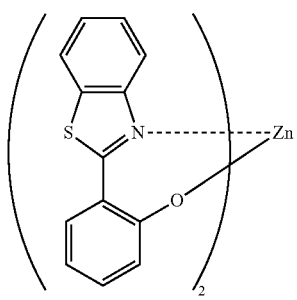

H-20
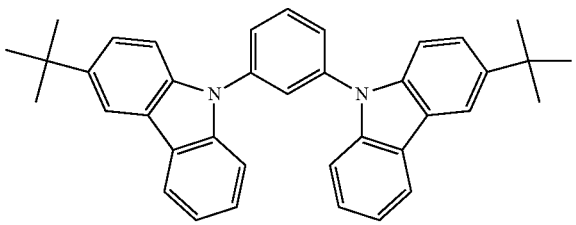

-continued

H-21
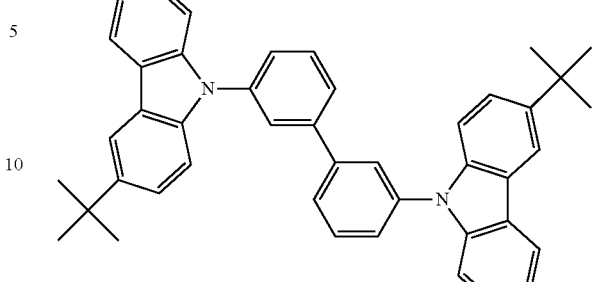

H-22
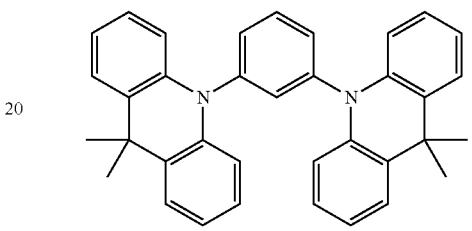

——Hole-Injection Layer and Hole-Transport Layer——

The hole-injection layer and hole-transport layer are layers having the function of receiving holes from the anode or from the anode side and transporting the holes to the cathode side. Hole-injection materials and hole-transporting materials which are to be incorporated respectively into the hole-injection layer and the hole-transport layer may be a low-molecular-weight compound or a high-molecular-weight compound.

Specifically, these layers preferably contain, for example, pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, phthalocyanine compounds, porphyrin compounds, thiophene derivatives, organosilane derivatives and carbon.

Also, an electron-accepting dopant may be incorporated into the hole-injection layer or the hole-transport layer. The electron-accepting dopant may be an inorganic or organic compound, so long as it has electron accepting property and the function of oxidizing an organic compound.

Specific examples of the inorganic compound include metal halides (e.g., ferric chloride, aluminum chloride, gallium chloride, indium chloride and antimony pentachloride) and metal oxides (e.g., vanadium pentaoxide and molybdenum trioxide). As the organic compound, those having a substituent such as a nitro group, a halogen atom, a cyano group and a trifluoromethyl group; quinone compounds; acid anhydride compounds; and fullerenes may be preferably used.

These electron-accepting dopants may be used alone or in combination. Although the amount of the electron-accepting dopant used depends on the type of material, the dopant is preferably used in an amount of 0.01% by mass to 50% by mass, more preferably 0.05% by mass to 20% by mass, particularly preferably 0.1% by mass to 10% by mass, with respect to the material of the hole-transport layer.

Each of the hole-injection layer and the hole-transport layer may have a single-layered structure made of one or more of the above-mentioned materials, or a multi-layered structure made of a plurality of layers which are identical or different in composition.

——Electron-Injection Layer and Electron-Transport Layer——

The electron-injection layer and the electron-transport layer are layers having the functions of receiving electrons from the cathode or the cathode side and transporting the electrons to the anode side. The electron-injection materials or electron-transport materials for these layers may be low-molecular-weight or high-molecular-weight compounds.

Specific examples thereof include pyridine derivatives, quinoline derivatives, pyrimidine derivatives, pyrazine derivatives, phthalazine derivatives, phenanthoroline derivatives, triazine derivatives, triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyradine derivatives, aromatic tetracarboxylic anhydrides such as perylene and naphthalene, phthalocyanine derivatives, metal complexes (e.g., metal complexes of 8-quinolinol derivatives, metal phthalocyanine, and metal complexes containing benzoxazole or benzothiazole as the ligand) and organic silane derivatives (e.g., silole).

The electron-injection layer or the electron-transport layer may contain an electron donating dopant. The electron donating dopant to be introduced in the electron-injection layer or the electron-transport layer may be any material, so long as it has an electron-donating property and a property for reducing an organic compound. Preferred examples thereof include alkali metals (e.g., Li), alkaline earth metals (e.g., Mg), transition metals including rare-earth metals, and reducing organic compounds. Among the metals, those having a work function of 4.2 eV or less are particularly preferably used. Examples thereof include Li, Na, K, Be, Mg, Ca, Sr, Ba, Y, Cs, La, Sm, Gd and Yb. Also, examples of the reducing organic compounds include nitrogen-containing compounds, sulfur-containing compounds and phosphorus-containing compounds.

These electron donating dopants may be used alone or in combination. The amount of the electron donating dopant used depends on the type of the material, but it is preferably 0.1% by mass to 99% by mass, more preferably 1.0% by mass to 80% by mass, particularly preferably 2.0% by mass to 70% by mass, with respect to the amount of the material of the electron transport layer.

Each of the electron-injection layer and the electron-transport layer may have a single-layered structure made of one or more of the above-mentioned materials, or a multi-layered structure made of a plurality of layers which are identical or different in composition.

——Hole Blocking Layer and Electron Blocking Layer——

The hole blocking layer is a layer having the function of preventing the holes, which have been transported from the anode side to the light-emitting layer, from passing toward the cathode side, and is generally provided as an organic compound layer adjacent to the light-emitting layer on the cathode side.

The electron blocking layer is a layer having the function of preventing the electrons, which have been transported from the cathode side to the light-emitting layer, from passing toward the anode side, and is generally provided as an organic compound layer adjacent to the light-emitting layer on the anode side in the present invention.

Examples of the compound forming the hole blocking layer include aluminum complexes (e.g., BAlq), triazole derivatives and phenanthroline derivatives (e.g., BCP). Examples of the compound forming the electron blocking layer include those listed as a hole-transport material.

The thickness of each of the hole blocking layer and the electron blocking layer is preferably 1 nm to 500 nm, more preferably 5 nm to 200 nm, still more preferably 10 nm to 100 nm. The hole blocking layer or the electron blocking layer may have a single-layered structure made of one or more of the above-mentioned materials, or a multi-layered structure made of a plurality of layers which are identical or different in composition.

——Electrode——

The organic electroluminescence element contains a pair of electrodes; i.e., an anode and a cathode. In consideration of the characteristics of the electroluminescence element, at least one of the anode and the cathode is preferably transparent.

In general, the anode may serve as an electrode which supplies holes to an organic compound layer, and the cathode may serve as an electrode which injects electrons into an organic compound layer. The shape, structure, size, etc. thereof are not particularly limited and may be appropriately selected from known electrode materials depending on the application/purpose of the electroluminescence element. Preferred examples of the material for the electrode include metals, alloys, metal oxides, conductive compounds and mixtures thereof.

The electrode is not particularly limited. Preferably, the anode and the cathode are formed from the reflective metal or a semi-transparent metal as the semi-transparent member.

Specific examples of the material for the anode include conductive metal oxides such as tin oxides doped with, for example, antimony and fluorine (ATO and FTO), tin oxide, zinc oxide, indium oxide, indium tin oxide (ITO) and indium zinc oxide (IZO); metals such as gold, silver, chromium and nickel; mixtures or laminates of these metals and the conductive metal oxides; inorganic conductive materials such as copper iodide and copper sulfide; organic conductive materials such as polyaniline, polythiophene and polypyrrole; and laminates of these materials and ITO. Among them, conductive metal oxides are preferred. In particular, ITO is preferred from the viewpoints of, for example, productivity, high conductivity and transparency.

Specific examples of the material for the cathode include alkali metals (e.g., Li, Na, K and Cs), alkaline earth metals (e.g., Mg and Ca), gold, silver, lead, aluminum, sodium-potassium alloys, lithium-aluminum alloys, magnesium-silver alloys and rare earth metals (e.g., indium and ytterbium). These may be used individually, but it is preferred that two or more of them are used in combination from the viewpoint of satisfactorily attaining both stability and electron-injectability. Among them, alkali metals or alkaline earth metals are preferred in terms of excellent electron-injectability, and materials containing aluminum as a major component are preferred in terms of excellent storage stability. The term "material containing aluminum as a major component" refers to a material composed of aluminum alone; alloys containing aluminum and 0.01% by mass to 10% by mass of an alkali or alkaline earth metal; or the mixtures thereof (e.g., lithium-aluminum alloys and magnesium-aluminum alloys).

The method for forming the electrode is not particularly limited and the electrode may be formed according to a known method. Examples of the method include wet methods such as printing methods and coating methods; physical methods such as vacuum deposition methods, sputtering methods and ion plating methods; and chemical methods such as CVD and plasma CVD methods. According to a method appropriately selected from these methods in consideration of suitability for the material for the electrode, the electrode can be formed on a substrate. For example, when ITO is used as the material for the anode, the anode may be formed with a DC or high-frequency sputtering method, a vacuum deposition method, or an ion plating method. Notably, when a metal, etc. are used as the material for the cathode, the cathode may be formed by, for example, sputtering one type of metal or two or more types of metals simultaneously or sequentially.

Patterning for forming the electrode may be performed by a chemical etching method such as photolithography; a physical etching method such as etching by laser; a method of vacuum deposition or sputtering using a mask; a lift-off method; or a printing method.

—Substrate—

The substrate is formed of, for example, inorganic materials such as yttria-stabilized zirconia (YSZ) and glass (alkali-free glass and soda-lime glass); and organic materials such as polyesters (e.g., polyethylene terephthalate, polybutylene phthalate and polyethylene naphthalate), polystyrene, polycarbonate, polyether sulfone, polyarylate, polyimide, polycycloolefin, norbornene resins and poly(chlorotrifluoroethylene).

The shape, structure, size, etc. of the substrate are not particularly limited and may be appropriately selected depending on, for example, the application/purpose of the formed light-emitting element. In general, the shape thereof is preferably a sheet shape. The substrate may have a single- or multi-layered structure, and may be a single member or a combination of two or more members. The substrate may be opaque, colorless transparent, or colored transparent.

The substrate may be provided with a moisture permeation-preventing layer (gas barrier layer) on the front or back surface thereof. The moisture permeation-preventing layer (gas barrier layer) is preferably made from an inorganic compound such as silicon nitride and silicon oxide. The moisture permeation-preventing layer (gas barrier layer) can be formed through, for example, high-frequency sputtering.

—Protective Layer—

In the present invention, the organic electroluminescence element may be entirely protected with a protective layer. The material contained in the protective layer is any materials so long as they have the function of preventing permeation of water, oxygen, etc., which accelerate degradation of the element.

Examples thereof include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal nitrides such as $SiN_x$ and $SiN_xO_y$; metal fluorides such as $MgF_2$, LiF, $AlF_3$ and $CaF_2$; polyethylenes, polypropylenes, polymethyl methacrylates, polyimides, polyureas, polytetrafluoroethylenes, polychlorotrifluoroethylens, polydichlorodifluoroethylenes, copolymers of chlorotrifluoroethylens and dichlorodifluoroethylenes, copolymers produced through copolymerization of a monomer mixture containing tetrafluoroethylene and at least one comonomer, fluorine-containing copolymers containing a ring structure in the copolymerization main chain, water-absorbing materials each having a water absorption rate of 1% or more, and moisture permeation preventive substances each having a water absorption rate of 0.1% or less.

The method for forming the protective layer is not particularly limited. Examples thereof include a vacuum deposition method, a sputtering method, a reactive sputtering method, a molecular beam epitaxial (MBE) method, a cluster ion beam method, an ion plating method, a plasma polymerization method (high-frequency excitation ion plating method), a plasma CVD method, a laser CVD method, a thermal CVD method, a gas source CVD method, a coating method, a printing method and a transfer method.

—Seal Container—

The organic electroluminescence element may be entirely sealed with a seal container. Further, a moisture absorbent or an inert liquid may be contained in the space between the seal container and the organic electroluminescence element. The moisture absorbent is not particularly limited. Examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite and magnesium oxide. The inert liquid is not particularly limited. Examples thereof include paraffins; liquid paraffins; fluorine-containing solvents such as perfluoroalkanes, perfluoroamines and perfluoroethers; chlorinated solvents; and silicone oils.

Furthermore, the below-described resin seal layer is suitably used for sealing.

—Resin Seal Layer—

The organic electroluminescence element is preferably sealed with a resin seal layer so as to prevent degradation thereof due to oxygen and/or moisture contained in the air.

The resin material for the resin seal layer is not particularly limited. Examples thereof include acrylic resins, epoxy resins, fluorine-containing resins, silicone resins, rubber resins and ester resins. Among them, epoxy resins are preferred from the viewpoint of preventing water permeation. Among the epoxy resins, thermosetting epoxy resins and photocurable epoxy resins are preferred.

The forming method for the resin seal layer is not particularly limited. Examples thereof include a method by coating a resin solution, a method by press-bonding or hot press-bonding a resin sheet, and a method by polymerizing under dry conditions (e.g., vapor deposition and sputtering).

—Sealing Adhesive—

A sealing adhesive has the function of preventing permeation of moisture or oxygen from the edges of the element. The material for the sealing adhesive may be those used in the resin seal layer. Among them, epoxy resins are preferred from the viewpoint of preventing water permeation, with photocurable epoxy resins and thermosetting epoxy resins being preferred.

Also, a filler is preferably added to the above materials. The filler added to the sealing adhesive is preferably inorganic materials such as $SiO_2$, SiO (silicon oxide), SiON (silicon oxynitride) and SiN (silicon nitride). The filler increases the viscosity of the sealing adhesive to improve processability and humidity resistance.

The sealing adhesive may also contain a desiccant. Examples of the desiccant include barium oxide, calcium oxide or strontium oxide. The amount of the desiccant added to the sealing adhesive is preferably 0.01% by mass to 20% by mass, more preferably 0.05% by mass to 15% by mass. When the amount is less than 0.01% by mass, the desiccant exhibits reduced effects. Whereas when the amount is more than 20% by mass, it may be difficult to homogeneously disperse the desiccant in the sealing adhesive.

In the present invention, the sealing adhesive containing the desiccant is applied in a predetermined amount using, for example, a dispenser. Thereafter, a second substrate is overlaid, followed by curing for sealing.

<Production Process>

The production process of the method of the present invention for producing a light-emitting display device is described referring to schematic figures of FIGS. 1 to 8. Notably, reference numerals 3 and 5 in some figures each denote a light-transmissive resin material, a light-transmissive resin layer or an optical path length-adjusting layer, which are formed of the same material.

First, reflective metals 2 are disposed on a substrate 1 so as to correspond to a plurality of pixels of red, green and blue (see FIG. 1).

Figure 2:
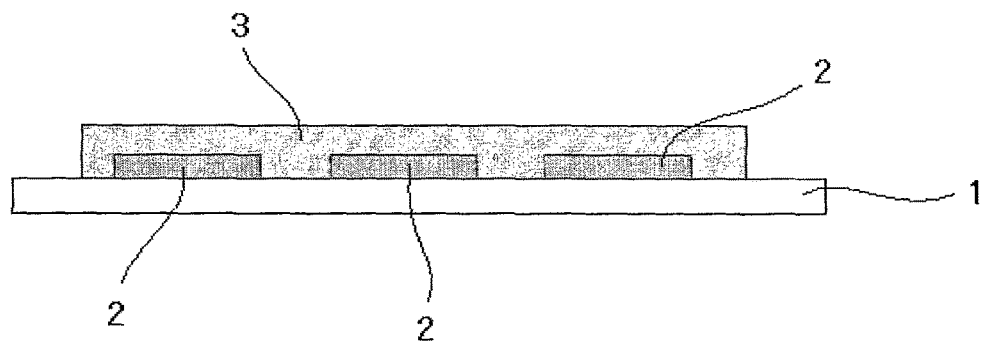
FIG. 2 schematically illustrates a step of a production process for a light-emitting display device of the present invention (part 2).
Figure 3:
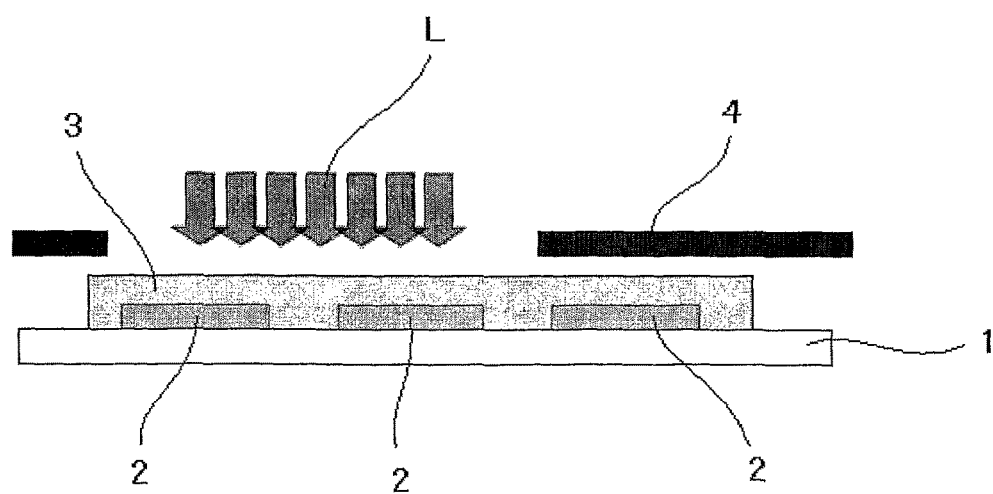
FIG. 3 schematically illustrates a step of a production process for a light-emitting display device of the present invention (part 3).

Next, by a flash evaporation method, a light-transmissive resin material 3 is formed on the substrate on which the reflective metals 2 have been disposed (a light-transmissive resin material film forming step, see FIG. 2).

The substrate 1, having the reflective metal 2 and the light-transmissive resin material 3, is covered with a mask 4 which allows the resin material to be partially exposed to light. In this state, light L is applied thereto so as to selectively expose (i.e., selectively cure) the light-transmissive resin material 3 in one pixel region and an adjacent pixel region thereto, to thereby form a light-transmissive resin layer 3 (a light-transmissive resin layer forming step, see FIG. 3).

Figure 4:
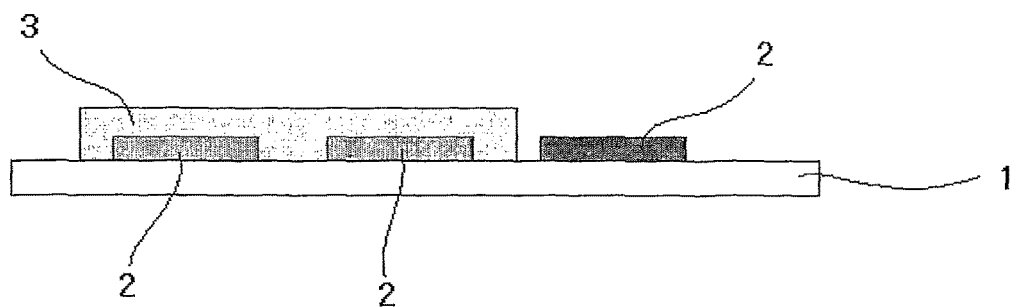
FIG. 4 schematically illustrates a step of a production process for a light-emitting display device of the present invention (part 4).

Through development, the unexposed portions are removed from the light-transmissive resin layer 3 to form an optical path length-adjusting layer 3 (an optical path length-adjusting layer forming step, see FIG. 4). Notably, when a photo-dissolvable resin is used as the light-transmissive resin material, the exposed portions may be removed through positive-type pattern transfer so as to form the unexposed optical path length-adjusting layer 3 on the reflective metals 2.

Figure 5:
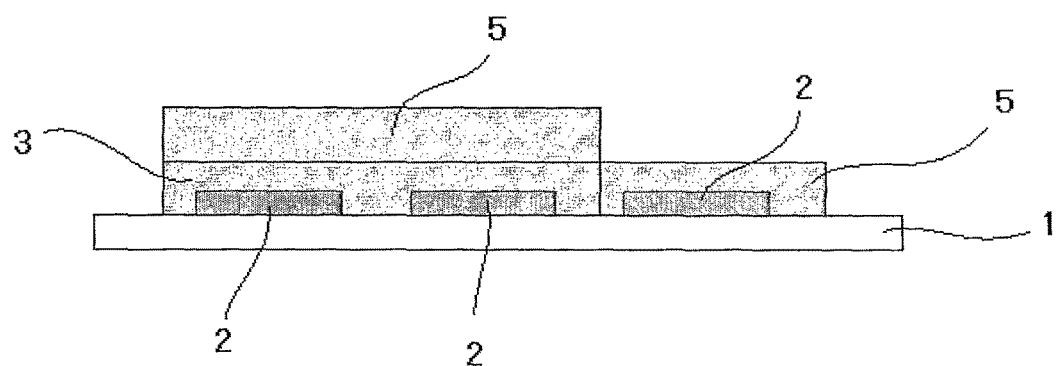
FIG. 5 schematically illustrates a step of a production process for a light-emitting display device of the present invention (part 5).
Figure 6:
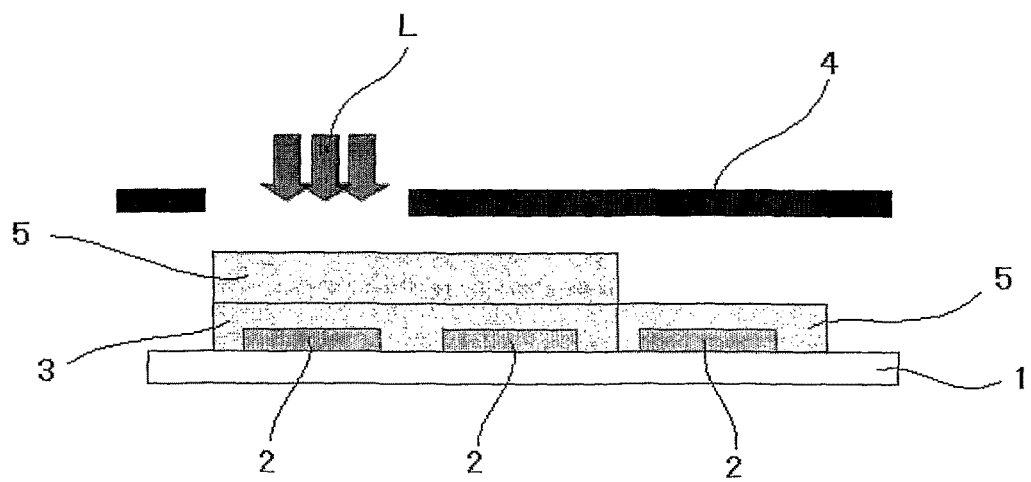
FIG. 6 schematically illustrates a step of a production process for a light-emitting display device of the present invention (part 6).

Next, in order to form different optical path lengths, a light-transmissive resin material 5 is formed through deposition by a flash evaporation method (a light-transmissive resin material film forming step, see FIG. 5). As a result of deposition, in the pixel regions where the optical path length-adjusting layer 3 has been formed on the reflective metals 2 in the previous step, the light-transmissive resin material 5 is superposed on the optical path length-adjusting layer 3 to form the optical path length difference with respect to the pixel region where the optical path length-adjusting layer 3 has not been formed.

The substrate 1, having the reflective metal 2, the optical path length-adjusting layer 3 and the light-transmissive resin material 5, is covered with a mask 4 which allows the resin material to be partially exposed to light. Light is applied to one of the two pixel regions where the light-transmissive resin material 5 is deposited on the optical path length-adjusting layer 3 so that the pixel region is exposed to light (i.e., cured), whereby a light-transmissive resin layer 5 is formed (a light-transmissive resin layer forming step, see FIG. 6).

Figure 7:
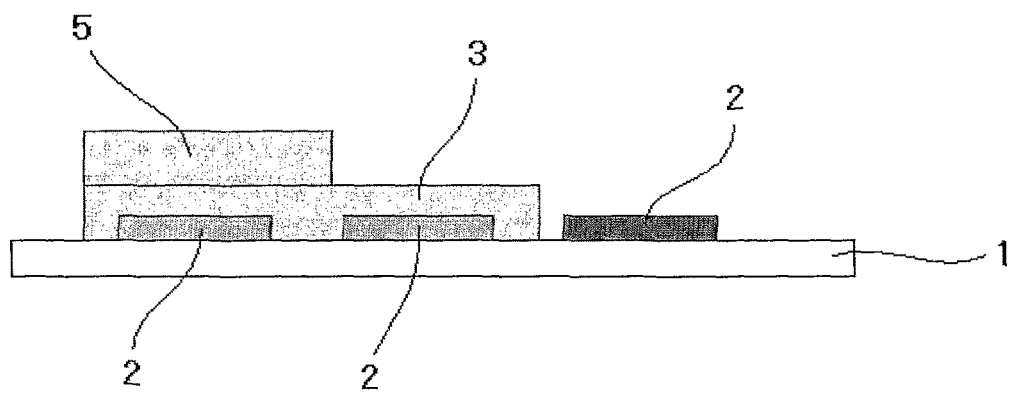
FIG. 7 schematically illustrates a step of a production process for a light-emitting display device of the present invention (part 7).
Figure 8:
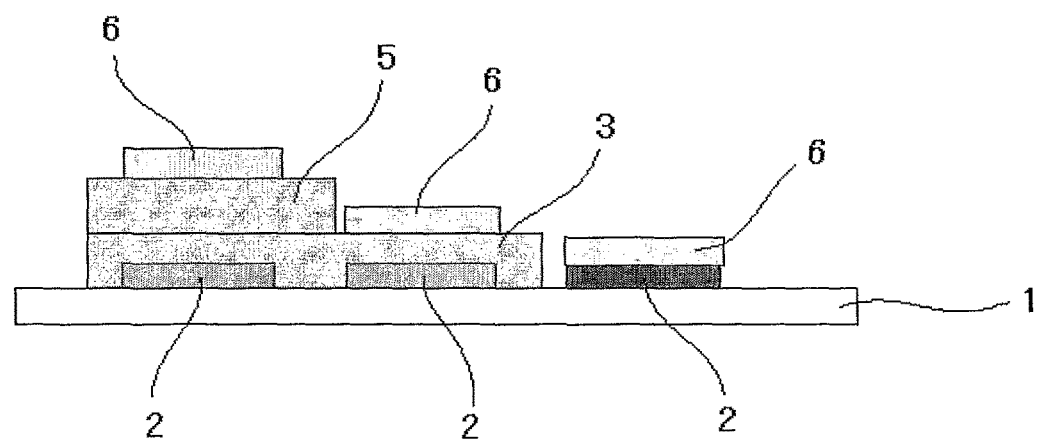
FIG. 8 schematically illustrates a step of a production process for a light-emitting display device of the present invention (part 8).

Through development, the unexposed portions are removed from the light-transmissive resin layer 5 to form an optical path length-adjusting layer 5 on one pixel region (an optical path length-adjusting layer forming step, see FIG. 7). As a result, the optical path length-adjusting layers 3 and 5 are formed in one pixel region in a superposed manner, and the optical path length-adjusting layer 3 is formed in the adjacent pixel region thereto.

Next, a transparent conductive film 6 is formed on the optical path length-adjusting layer 5 in the pixel region where the optical path length-adjusting layers 3 and 5 have been disposed. At the same time, a transparent conductive film 6 is formed on the optical path length-adjusting layer 3 in the pixel region where the optical path length-adjusting layer 3 has been disposed; and a transparent conductive film 6 is formed on the reflective metal 2 in the pixel region where no optical path length-adjusting layer has been disposed.

Figure 9:
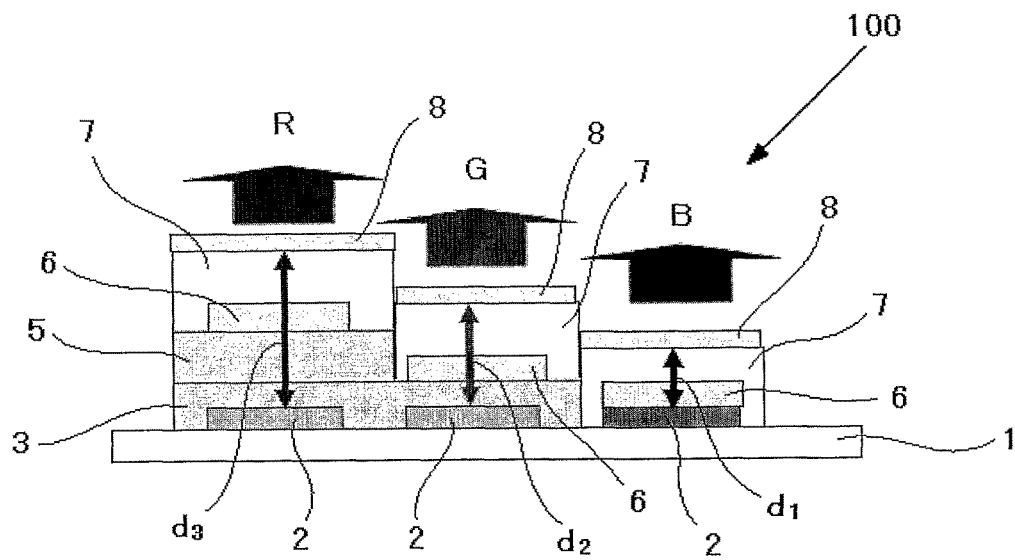
FIG. 9 is a schematic illustration of one exemplary structure of a light-emitting display device of the present invention.

Next, an organic light-emitting layer 7 and a semi-transparent member 8 are laminated in this order on the transparent conductive films 6 in the three pixel regions, whereby a light-emitting display device 100 is produced (see FIG. 9).

In the light-emitting display device 100 produced in such a manner, lights having been emitted from the organic light-emitting layers 7 are extracted from the semi-transparent members 8 as those having wavelengths of blue, green and red corresponding to optical path lengths $d_1$, $d_2$ and $d_3$ which have been adjusted by the optical path length-adjusting layers 3 and 5.

That is, lights having been emitted from the organic light-emitting layers 7 are resonated between the semi-transparent members 8 and the reflective metals 2 (i.e., through optical paths with lengths of $d_1$, $d_2$ and $d_3$). As a result, lights having wavelengths of blue, green and red corresponding to the optical path lengths are intensified and can be extracted from the light-emitting display device 100 as blue, green and red lights.

According to the above-described production process of the present invention for the light-emitting display device 100, the formation of optical path length differences does not require formation of a resist layer, etching using the resist layer as a mask, and releasing of the resist layer. Thus, this production process is considerably simplified as compared with conventional production processes.

(Light-Emitting Display Device)

A light-emitting display device of the present invention includes a substrate over which a reflective metal and a semi-transparent member are disposed in at least one of a plurality of pixel regions corresponding to red, green and blue, and an optical path length-adjusting layer formed, on the substrate, of a light-transmissive resin material; and further includes a light-emitting display element required for forming the light-emitting display device.

The light-emitting display device is not particularly limited, so long as it has the above described structure, and may be appropriately selected depending on the purpose. The light-emitting display device is preferably produced according to the method of the present invention for producing a light-emitting display device. Every matter described as to the method of the present invention for producing a light-emitting display device can be applied.

In the light-emitting display device, lights having been emitted from the organic light-emitting layers can be extracted as those having wavelengths of blue, green and red corresponding to the optical path lengths, which vary with the presence or absence of the optical path length-adjusting layer and/or with the thickness thereof. Also, color filters corresponding to blue, green and red may be io further disposed in the corresponding pixel regions at the side of an observer of the light-emitting display device so as to attain higher definite full color display.

—First Embodiment—

One exemplary structure of the light-emitting display device is described with reference to FIG. 9. A light-emitting display device 100 is a top emission-type light-emitting display device.

The light-emitting display device 100 has, on a substrate 1, reflective metals 2 in red, green and blue pixel regions.

In the red pixel region, optical path length-adjusting layers 3 and 5 are disposed so as to cover a reflective metal 2, and a semi-transparent member (cathode) 8 is disposed so as to face the reflective metal 2 via a transparent conductive film (anode) 6 and an organic light-emitting layer 7. In this red pixel region, the optical path length is adjusted to $d_3$ by the optical path length-adjusting layers 3 and 5, which are provided between the reflective metal 2 and the semi-transparent member 8 together with the transparent conductive film 6 and the organic light-emitting layer 7.

In the green pixel region, the optical path length-adjusting layer 3 is disposed so as to cover a reflective metal 2, and a semi-transparent member 8 is disposed so as to face the reflective metal 2 via a transparent conductive film 6 and an organic light-emitting layer 7. In this green pixel region, the optical path length is adjusted to $d_2$ by the optical path length-adjusting layer 3, which is provided between the reflective metal 2 and the semi-transparent member 8 together with the transparent conductive film 6 and the organic light-emitting layer 7.

In the blue pixel region, a semi-transparent member 8 is disposed so as to face a reflective metal 2 via a transparent conductive film 6 and an organic light-emitting layer 7. In this blue pixel region, the optical path length $d_1$ is formed between the reflective metal 2 and the semi-transparent member 8, the transparent conductive film 6 and the organic light-emitting layer 7 being disposed therebetween.

In the light-emitting display device 100 produced in such a manner, lights having been emitted from the organic light-emitting layers 7 are resonated between the reflective metal 2 and the semi-transparent member 8. As a result, lights having wavelengths corresponding to the optical path lengths $d_1$, $d_2$ and $d_3$ are intensified and can be extracted from the semi-transparent member 8 as blue, green and red lights.

—Second Embodiment—

Figure 10:
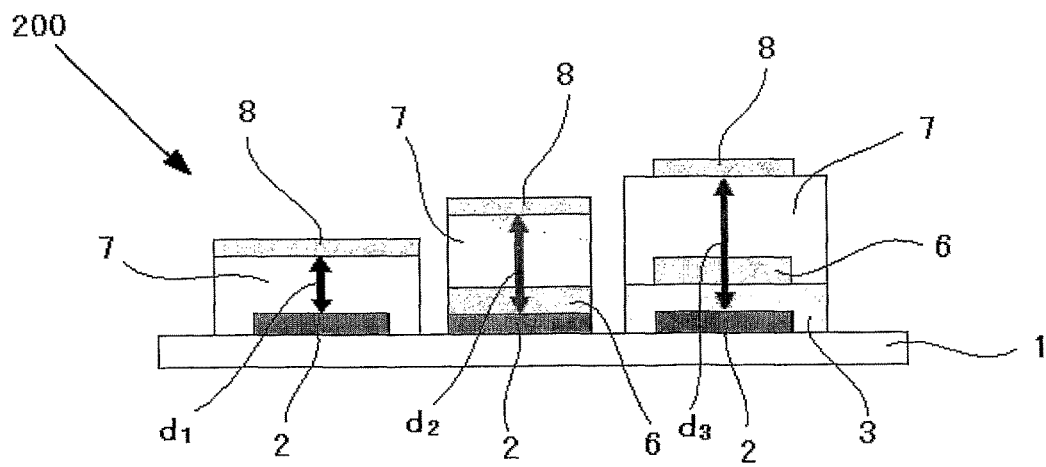
FIG. 10 is a schematic illustration of another exemplary structure of a light-emitting display device of the present invention.

Another exemplary structure of the light-emitting display device is described with reference to FIG. 10. A light-emitting display device 200 is a top emission-type light-emitting display device.

In the light-emitting display device 200, in the red pixel region, an optical path length-adjusting layer 3 is disposed so as to cover a reflective metal 2, and a semi-transparent member 8 is disposed so as to face the reflective metal 2 via a transparent conductive film 6 and an organic light-emitting layer 7. In this red pixel region, the optical path length is adjusted to $d_3$ by the optical path length-adjusting layer 3, which is provided between the reflective metal 2 and the semi-transparent member 8 together with the transparent conductive film 6 and the organic light-emitting layer 7.

In the green pixel region, a semi-transparent member 8 is disposed so as to face a reflective metal 2 via a transparent conductive film 6 and an organic light-emitting layer 7. In this green pixel region, the optical path length $d_2$ is formed between the reflective metal 2 and the semi-transparent member 8, the transparent conductive film 6 and the organic light-emitting layer 7 being formed therebetween.

In the blue pixel region, a semi-transparent member 8 is disposed so as to face a reflective metal 2 via an organic light-emitting layer 7. In this blue pixel region, the optical path length $d_1$ is formed between the reflective metal 2 and the semi-transparent member 8, the organic light-emitting layer 7 being disposed therebetween.

In the blue pixel region, a reflective metal 2 disposed on the substrate 1 is formed of an electrode material so as to serve as an electrode similar to the transparent conductive film 6.

Other information for this embodiment is omitted, since it is the same as in the first embodiment.

—Third Embodiment—

Figure 11:
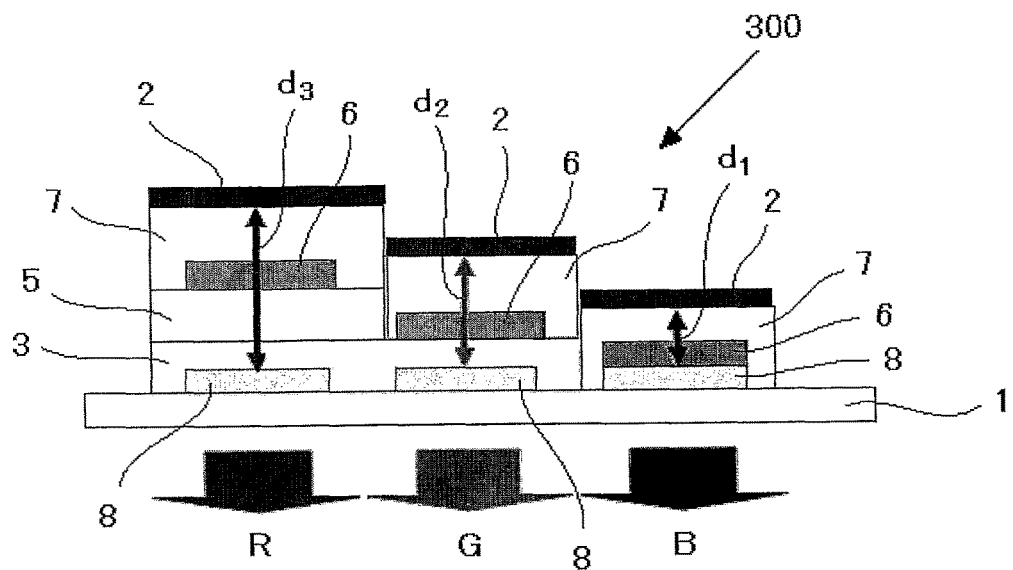
FIG. 11 is a schematic illustration of still another exemplary structure of a light-emitting display device of the present invention.
Figure 12:
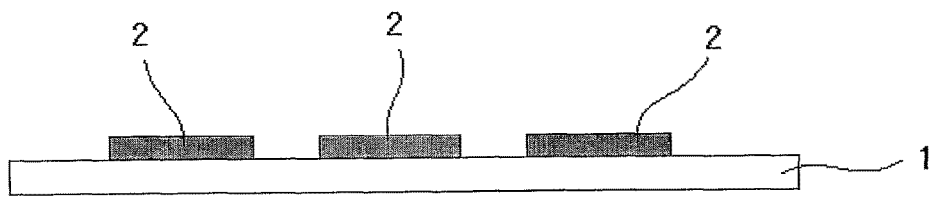
FIG. 12 schematically illustrates a step of a conventional production process for a light-emitting display device (part 1).
Figure 13:
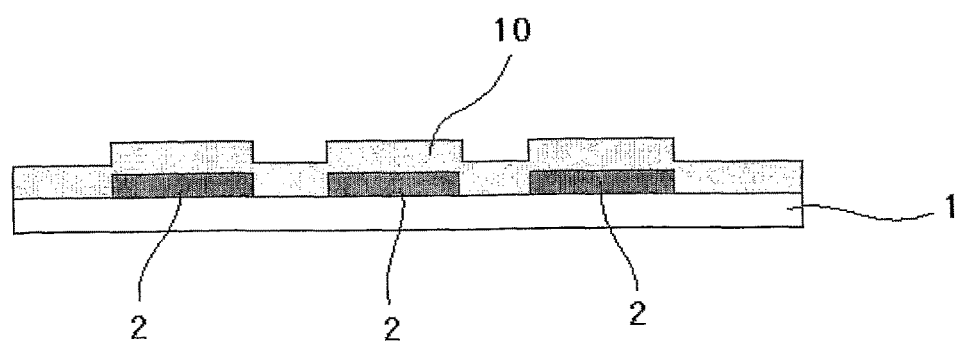
FIG. 13 schematically illustrates a step of a conventional production process for a light-emitting display device (part 2).
Figure 14:
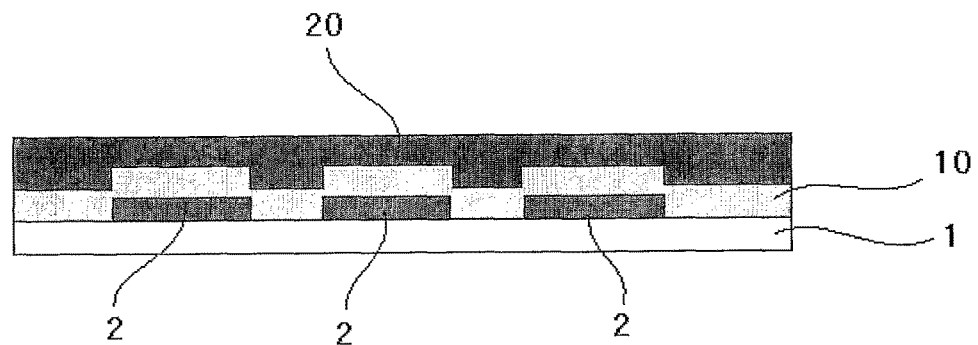
FIG. 14 schematically illustrates a step of a conventional production process for a light-emitting display device (part 3).
Figure 15:
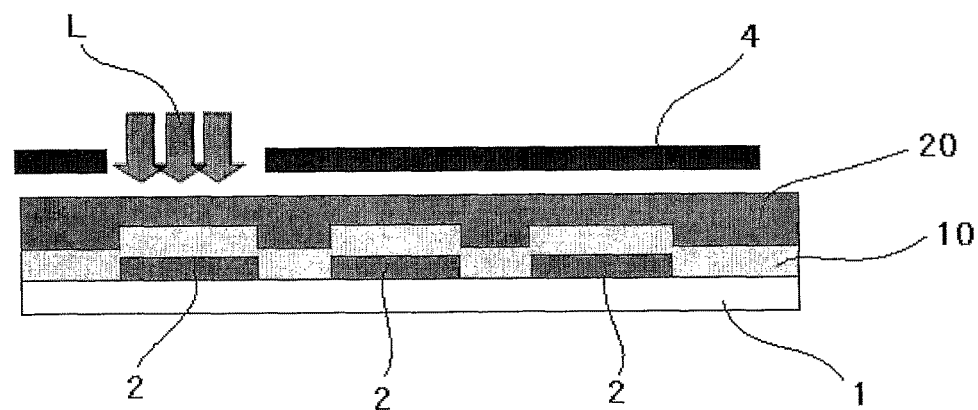
FIG. 15 schematically illustrates a step of a conventional production process for a light-emitting display device (part 4).
Figure 16:
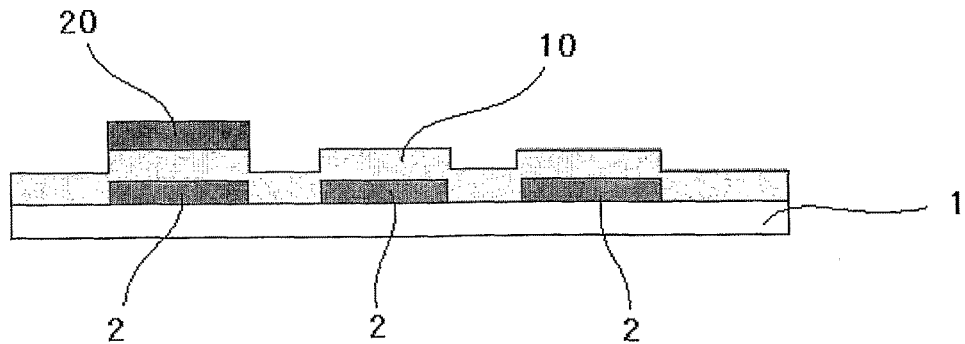
FIG. 16 schematically illustrates a step of a conventional production process for a light-emitting display device (part 5).
Figure 17:
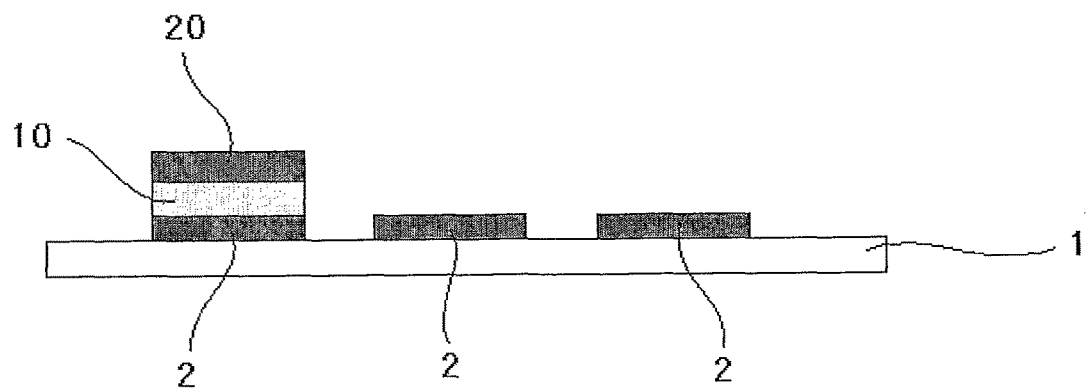
FIG. 17 schematically illustrates a step of a conventional production process for a light-emitting display device (part 6).
Figure 18:
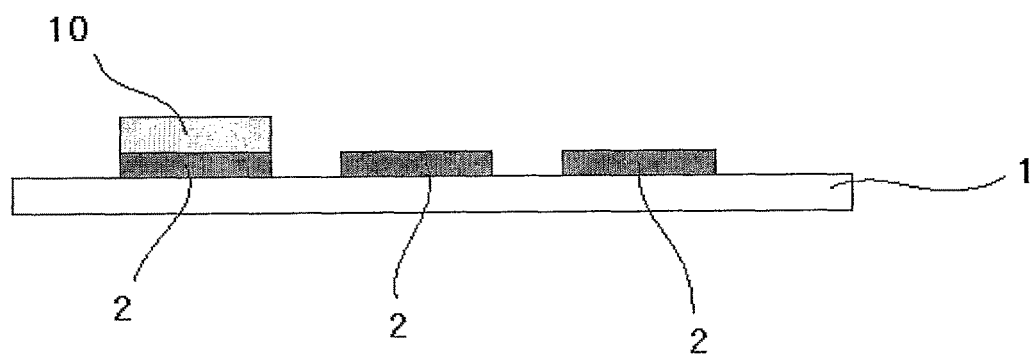
FIG. 18 schematically illustrates a step of a conventional production process for a light-emitting display device (part 7).
Figure 19:
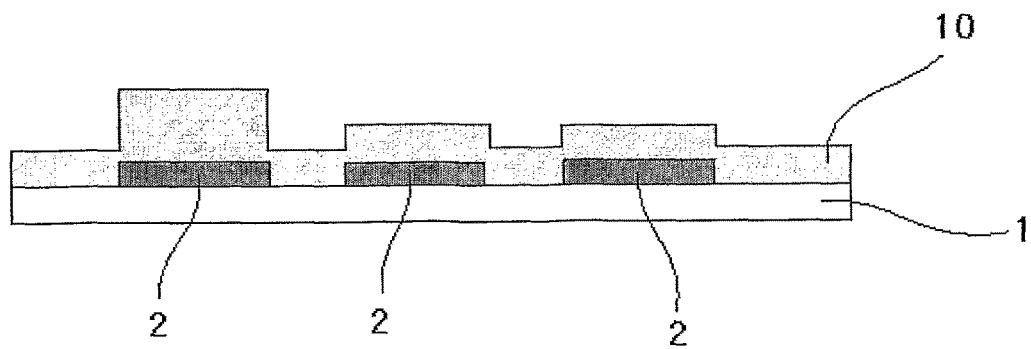
FIG. 19 schematically illustrates a step of a conventional production process for a light-emitting display device (part 8).
Figure 20:
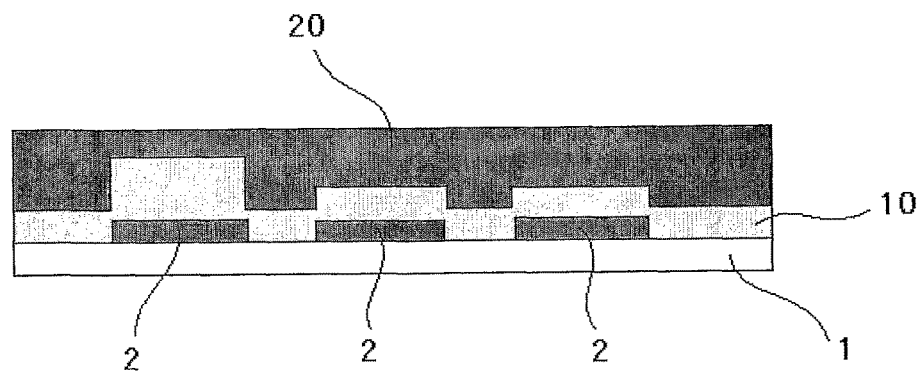
FIG. 20 schematically illustrates a step of a conventional production process for a light-emitting display device (part 9).
Figure 21:
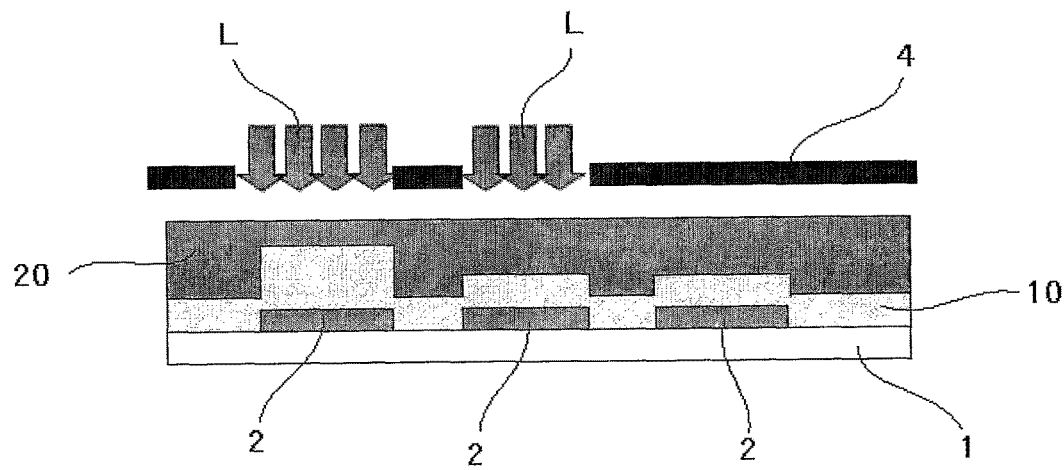
FIG. 21 schematically illustrates a step of-a conventional production process for a light-emitting display device (part 10).
Figure 22:
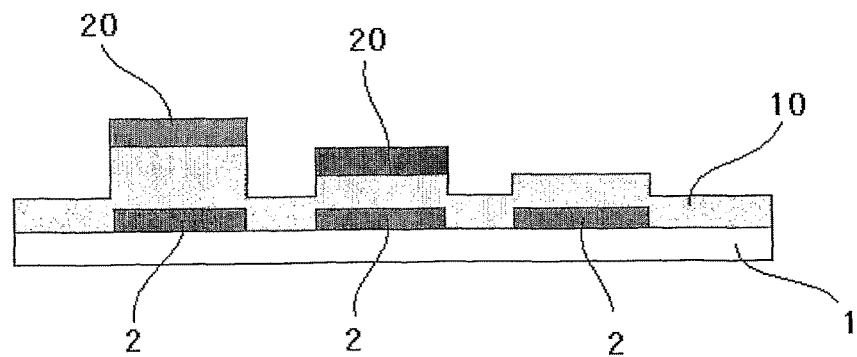
FIG. 22 schematically illustrates a step of a conventional production process for a light-emitting display device (part 11).
Figure 23:
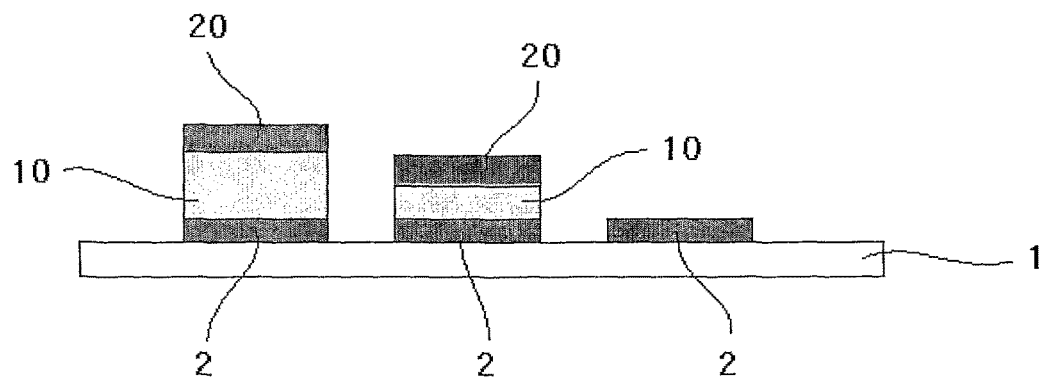
FIG. 23 schematically illustrates a step of a conventional production process for a light-emitting display device (part 12).
Figure 24:
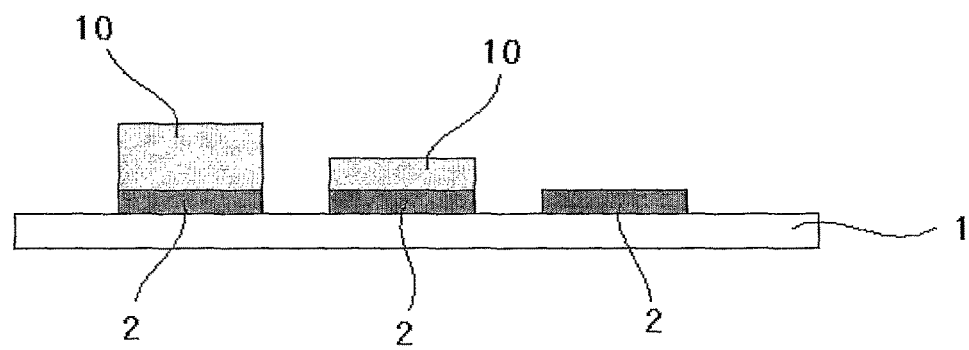
FIG. 24 schematically illustrates a step of a conventional production process for a light-emitting display device (part 13).
Figure 25:
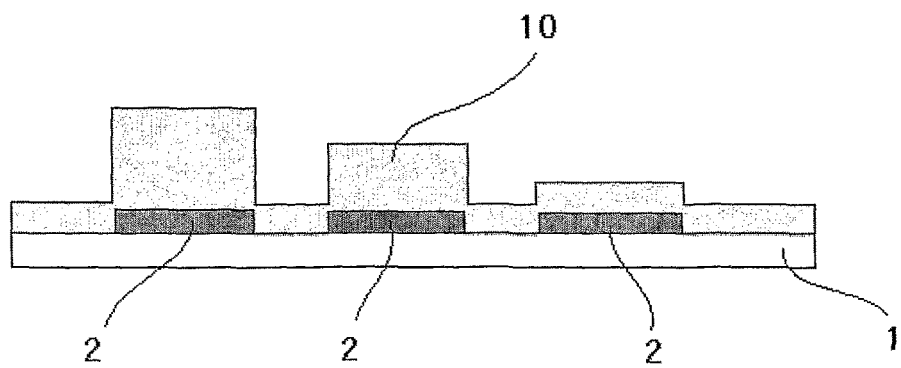
FIG. 25 schematically illustrates a step of a conventional production process for a light-emitting display device (part 14).
Figure 26:
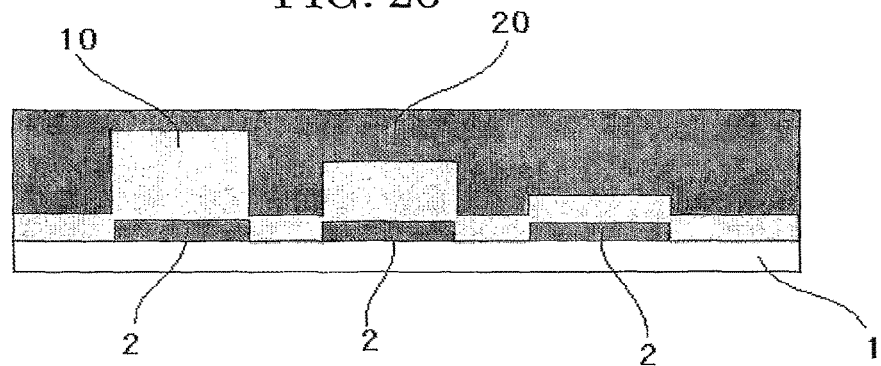
FIG. 26 schematically illustrates a step of a conventional production process for a light-emitting display device (part 15).
Figure 27:
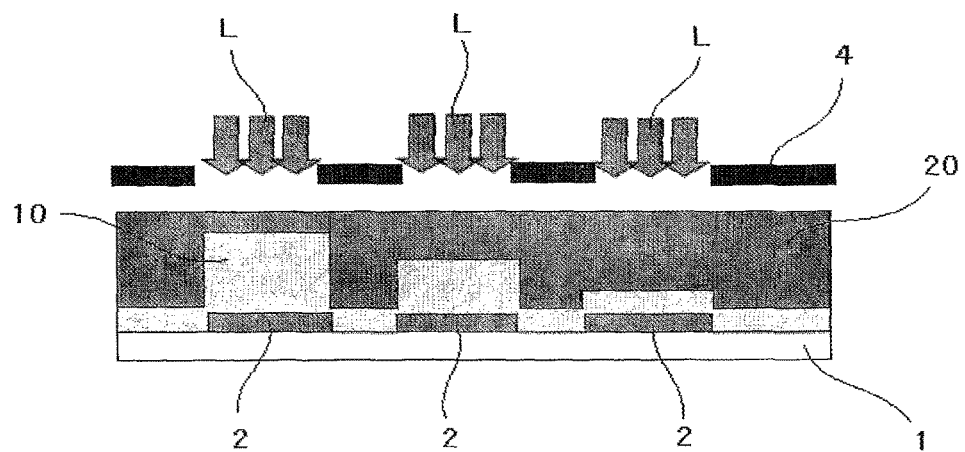
FIG. 27 schematically illustrates a step of a conventional production process for a light-emitting display device (part 16).
Figure 28:
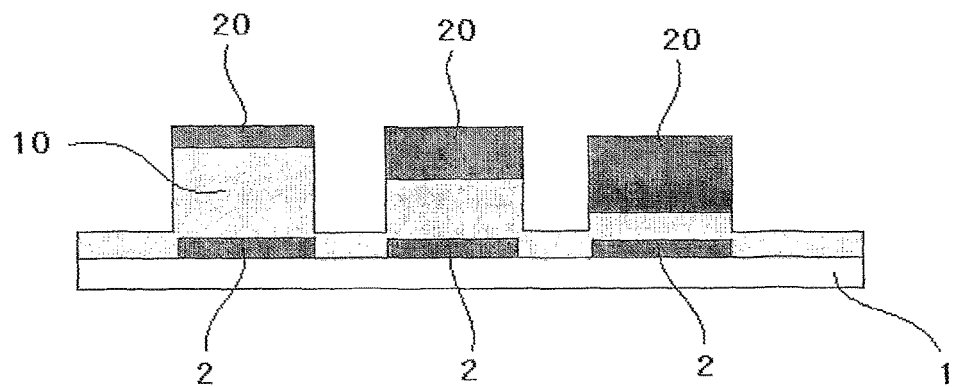
FIG. 28 schematically illustrates a step of a conventional production process for a light-emitting display device (part 17).
Figure 29:
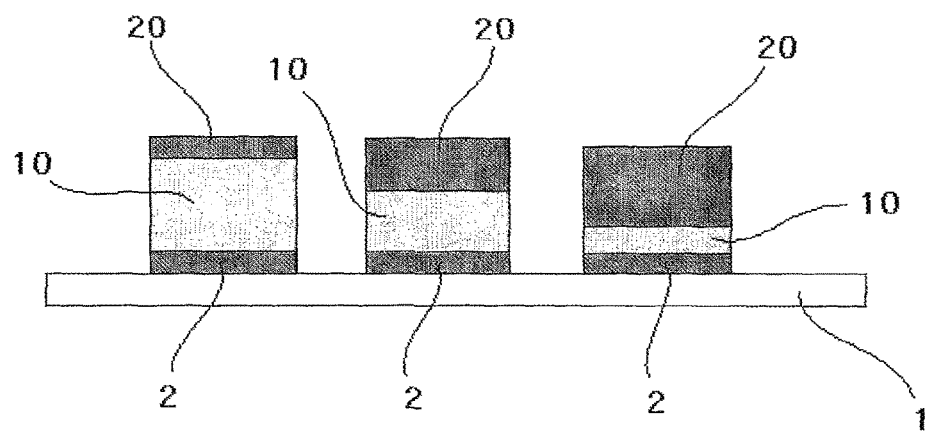
FIG. 29 schematically illustrates a step of a conventional production process for a light-emitting display device (part 18).
Figure 30:
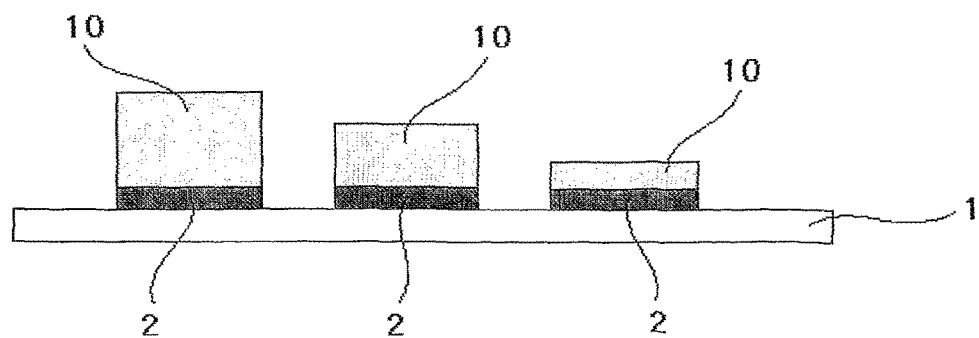
FIG. 30 schematically illustrates a step of a conventional production process for a light-emitting display device (part 19).
Figure 31:
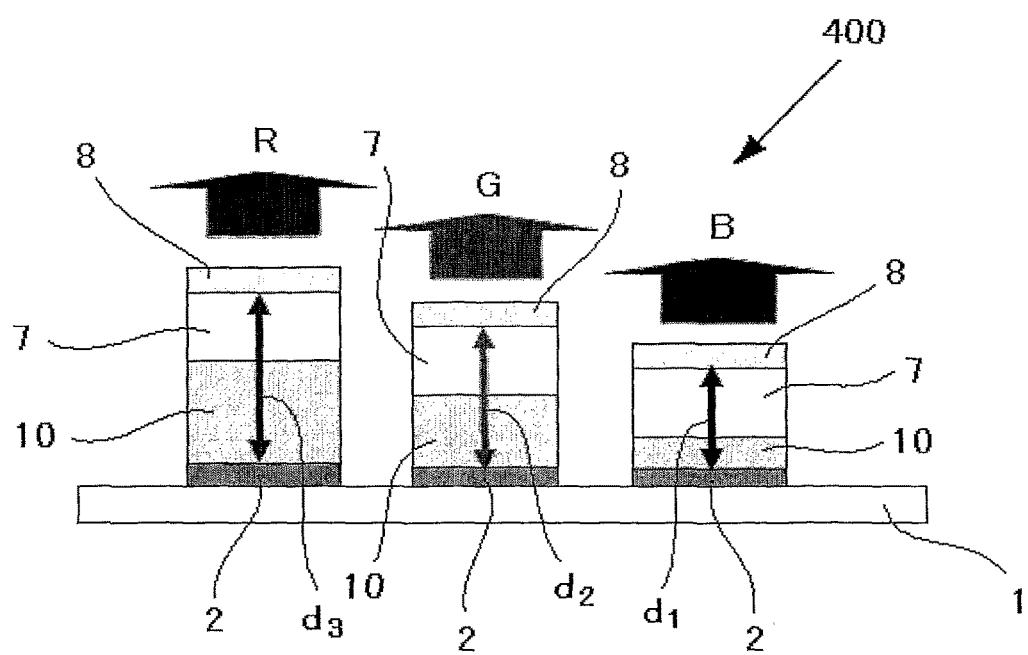
FIG. 31 is a schematic illustration of one structure of a conventional light-emitting display device.

One exemplary structure of the light-emitting display device is described with reference to FIG. 11. A light-emitting display device 300 is a bottom emission-type light-emitting display device.

In the light-emitting display device 300, semi-transparent members 8 are provided in red, green and blue pixel regions of a substrate 1.

In the red pixel region, optical path length-adjusting layer 3 and 5 are disposed so as to cover the semi-transparent member 8, and a reflective metal 2 is disposed so as to face the semi-transparent member 8 via a transparent conductive film 6 and an organic light-emitting layer 7. In this red pixel region, the optical path length is adjusted to $d_3$ by the optical path length-adjusting layers 3 and 5, which are provided between the semi-transparent member 8 and the reflective metal 2 together with the transparent conductive film 6 and the organic light-emitting layer 7.

In the green pixel region, an optical path length-adjusting layer 3 is disposed so as to cover a semi-transparent member 8, and a reflective metal 2 is disposed so as to face the semi-transparent member 8 via a transparent conductive film 6 and an organic light-emitting layer 7. In this green pixel region, the optical path length is adjusted to $d_2$ by the optical path length-adjusting layer 3, which is provided between the semi-transparent member 8 and the reflective metal 2 together with the transparent conductive film 6 and the organic light-emitting layer 7.

In the blue pixel region, a reflective metal 2 is disposed so as to face a semi-transparent member 8 via a transparent conductive film 6 and an organic light-emitting layer 7. In this blue pixel region, the optical path length $d_1$ is formed between the semi-transparent member 8 and the reflective metal 2, the transparent conductive film 6 and the organic light-emitting layer 7 being formed therebetween.

Other information for this embodiment is omitted, since it is the same as in the first embodiment.

(Light-Emitting Display)

A light-emitting display of the present invention includes the above-described light-emitting display device of the present invention; and, if necessary, may include other components.

The light-emitting display contains an optical path length-adjusting layer formed of a light-transmissive resin material. And, since its light-emitting display area is flexible and involves no cracks due to application of stress, the light-emitting display can be used as a flexible display.

The other components are not particularly limited and may be appropriately selected depending on the purpose. Every known component required for displays can be applied.

EXAMPLES

The present invention is described by way of examples, which should not be construed as limiting the present invention thereto.

Example 1

A 100 nm aluminum film was formed on a substrate by a vacuum vapor deposition method. Next, a reflective electrode (reflective metal) was formed through a photolithography process. By a flash evaporation method using a light-transmissive resin material (radical polymerizable monomer, product name: 1,10-decandiol dimethacrylate, product of Shin-Nakamura Chemical Co., Ltd.), a 45 nm film was formed on the substrate on which the reflective electrode had been formed (a light-transmissive resin material film forming step).

Next, using an exposure apparatus (product name: KP364N2, product of DAINIPPON SCREEN MFG. CO. LTD.), one pixel region was selectively exposed to light through a mask, to thereby form a light-transmissive resin layer (a light-transmissive resin layer forming step).

Next, a solvent (product name: 2-propanol, product of WAKI) was used for development to form the first optical path length of 45 nm (an optical path length-adjusting layer forming step). The amount of the radical monomer remaining was found to be $3.0 \times 10^{-3}$ g/m$^2$.

In order to form an optical path length difference between the one pixel region and an adjacent pixel region thereto, a 40 nm film was formed using again the above light-transmissive resin material (a light-transmissive resin material film forming step).

Next, the light-transmissive resin material in the one pixel region and the adjacent pixel region thereto was selectively exposed to light similar to the above, to thereby form a light-transmissive resin layer (a light-transmissive resin layer forming step).

Next, development was performed similarly to form the second optical path having a length of 40 nm in the one pixel region and to form the first optical path having the same length in the adjacent pixel region to the one pixel region (an optical path length-adjusting layer forming step).

On the optical path length-adjusting layer, a transparent electrode (made of ITO, IZO, etc., here, each being made of ITO) was electrically formed on each sub pixel separately. The transparent electrode was patterned by a film forming method using a shadow mask. Notably, patterning may be performed by a photolithography method on a film entirely formed.

A white organic electroluminescence layer (white OLED) was formed on the top surface of the transparent electrode by a vacuum film-forming apparatus (product name: CM457, product of TOKKI Corporation).

A metal electrode (aluminum) serving as a light-reflective electrode was formed on the top surface of the white OLED by a vacuum film-forming apparatus (product name: CM457, product of TOKKI Corporation).

A region where the OLED had been formed was sealed with a glass can, and each electrode was connected to a signal controlling device externally provided, to thereby produce a light-emitting display device of Example 1.

A plurality of the light-emitting display devices were arranged to produce a light-emitting display of Example 1.

The light-emitting display produced in this manner was evaluated in terms of the light-emitting state of the optical display, and as a result highly definite emission of RGB lights was confirmed.

Example 2

The procedure of Example 1 was repeated, except that in the light-transmissive resin material film forming step, film formation was performed using a spin coating apparatus (product name: SP-40, product of MITSUI SEIKI) instead of the flash evaporation method, to thereby produce a light-emitting display device and a light-emitting display of Example 2. Notably, the first optical path length was 45 nm and the second optical path length (the first optical path length in the adjacent pixel region) was 40 nm.

The produced light-emitting display was evaluated in terms of the light-emitting state of the optical display, and as a result highly definite emission of RGB lights was confirmed.

Example 3

The procedure of Example 1 was repeated, except that in the light-transmissive resin material film forming step, film formation was performed using a spray coater (product name: DC110, product of Sanmei Electronics Co., Ltd.) instead of the flash evaporation method, to thereby produce a light-emitting display device and a light-emitting display of Example 3. Notably, the first optical path length was 45 nm and the second optical path length (the first optical path length in the adjacent pixel region) was 40 nm.

The produced light-emitting display was evaluated in terms of the light-emitting state of the optical display, and as a result highly definite emission of RGB lights was confirmed.

Example 4

The procedure of Example 1 was repeated, except that in the light-transmissive resin material film forming step, film formation was performed as follows instead of the flash evaporation method, to thereby produce a light-emitting display device and a light-emitting display of Example 4. Specifically, a film of the light-transmissive resin material was formed by an ink-jet method using an ink-jet printer DMP-2831 (product of FDMX), with the jetting amount of the head cartridges and the jetting frequency being set to 10 pL and 10 kHz, respectively. Notably, the first optical path length was 45 nm and the second optical path length (the first optical path length in the adjacent pixel region) was 40 nm.

The produced light-emitting display was evaluated in terms of the light-emitting state of the optical display, and as a result highly definite emission of RGB lights was confirmed.

Example 5

The procedure of Example 1 was repeated, except that the light-transmissive resin material film forming step was performed as follows, to thereby produce a light-emitting display device and a light-emitting display of Example 5.

Specifically, 10 g of novolak resin EP4000B (product of ASAHI ORGANIC CHEMICALS INDUSTRIES CO., LTD.), 2.5 g of the following photosensitizer, 0.56 g of crosslinking agent TEP-G (product of ASAHI ORGANIC CHEMICALS INDUSTRIES CO., LTD.) and 53 g of a mixture of PEGMEA/siloxane (=1/1) were dissolved to prepare a light-transmissive resin material (positive-type resist material).

The photosensitizer used was prepared as follows. Specifically, 51 parts by mass (0.12 mole) of 1-[1-(4-hydroxyphenyl)isopropyl]-4-[1,1-bis(4-hydroxyphenyl)ethyl]benzene and 72.5 parts by mass (0.27 mole) of 1,2-naphthoquinone diazide-4-sulfonic acid chloride were dissolved in 450 mL of tetrahydrofuran. Subsequently, 28.3 parts by mass (0.28 mole) of triethylamine was added dropwise to the resultant solution, followed by reaction at room temperature for 20 hours. The triethylamine hydrochloride that precipitated was removed through filtration. The resultant product was charged into 10 L of an ion-exchange water. The obtained precipitates were allowed to aggregate and dried under vacuum for 48 hours at room temperature.

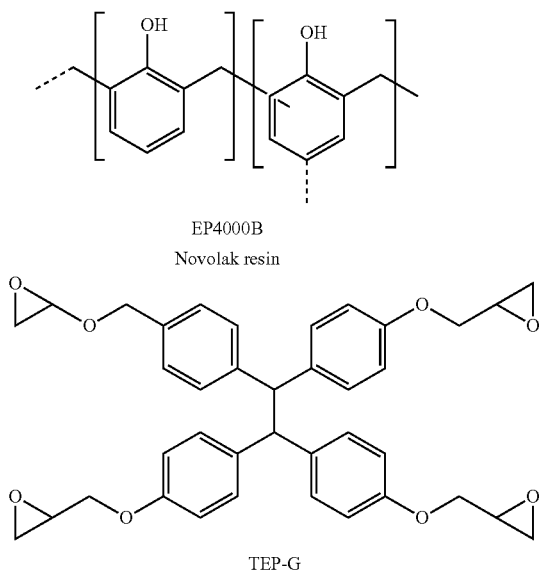

EP4000B
Novolak resin

TEP-G

A 100 nm aluminum film was formed on a substrate by a vacuum vapor deposition method. Next, a reflective electrode (reflective metal) was formed through a photolithography process. Using a spray coater (product name: DC110, product of Sanmei Electronics Co., Ltd.), a film of the light-transmissive resin material was formed on the substrate on which the reflective electrode had been formed.

Next, using an exposure apparatus (product name: KP364N2, product of DAINIPPON SCREEN MFG. CO. LTD.), one pixel region was selectively exposed to light through a mask, to thereby form a light-transmissive resin layer (a light-transmissive resin layer forming step). The first optical path length was 45 nm and the second optical path length (the first optical path length in the adjacent pixel region) was 40 nm. The amount of the radical monomer remaining was found to be $2.20 \times 10^{-3}$ g/m².

The produced light-emitting display was evaluated in terms of the light-emitting state of the optical display, and as a result highly definite emission of RGB lights was confirmed.

INDUSTRIAL APPLICABILITY

The method of the present invention for producing a light-emitting display device is a light-emitting display device-producing method which has a simple production process and which can be widely used. The light-emitting display device produced by this method realizes highly definite full-color display and thus, is used in a wide variety of fields such as a cellular phone display, a personal digital assistant (PDA), a computer display, an automobile information display, a TV monitor and a general light.

REFERENCE SIGNS LIST

1: Substrate
2: Reflective metal
3, 5: Optical path length-adjusting layer (light-transmissive resin material, bight-transmissive resin layer)
4: Mask
6: Transparent conductive film (anode)
7: Organic light-emitting layer
8: Semi-transparent member (cathode)
10: ITO film (optical path length-adjusting layer)
20: Resist layer
100, 200, 300, 400: Light-emitting display device

The invention claimed is:

1. A method for producing a light-emitting display device, the method comprising:
   forming a film of a light-transmissive resin material on a substrate over which at least two reflective metals and corresponding semi-transparent cathode members are disposed in at least two pixel regions corresponding to red, green or blue,
   curing part of the film of the light-transmissive resin material in an environment having an oxygen concentration of 2% or lower, to form a light-transmissive resin layer, the part being in a region including the at least two pixel regions,
   developing the light-transmissive resin layer after the curing to form a first optical path length-adjusting layer over a first and second of the at least two reflective metals, and
   forming transparent conductive anode films between each reflective metal, and the corresponding semi-transparent cathode member,
   wherein the first optical path length-adjusting layer is between the at least two reflective metals and the transparent conductive anode films, and
   wherein the light-transmissive resin material is formed of 1,10 decanediol methacrylate.

2. The method according to claim 1, wherein the forming the film of the light-transmissive resin material is performed by a vapor-phase film forming method.

3. The method according to claim 2, wherein the vapor-phase film forming method is a flash evaporation method.

4. The method according to claim 1, wherein the forming the film of the light-transmissive resin material is performed by a spray coating method.

5. The method according to claim 1, wherein the forming the film of the light-transmissive resin material is performed by an ink jet method.

6. The method according to claim 1, wherein the light-transmissive resin material is a photocurable resin.

7. The method according to claim 6, wherein the photocurable resin is formed of a radical polymerizable monomer.

8. The method according to claim 7, wherein the radical polymerizable monomer contains two or more radical polymerizable functional groups.

9. The method according to claim 7, wherein the radical polymerizable monomer is a monomer containing an ethylenically unsaturated double bond-containing group.

10. The method according to claim 9, wherein the monomer containing an ethylenically unsaturated double bond-containing group is one of an acrylic acid ester and a methacrylic acid ester.

11. The method according to claim 7, wherein the curing the part of the film of the light-transmissive resin material is performed by exposing and radical-polymerizing the radical polymerizable monomer in the presence of a photopolymerization initiator.

12. The method according to claim 7, wherein the amount of the radical polymerizable monomer remaining in the first optical path length-adjusting layer is $1 \times 10^{-2}$ g/m$^2$ or lower.

13. The method according to claim 1, wherein the first optical path length-adjusting layer is formed on a planarizing film, and the planarizing film is formed of the same light-transmissive resin material as the light-transmissive resin material of the first optical path length-adjusting layer.

14. The method according to claim 1, wherein the light-transmissive resin material is a photo-dissolvable resin.

15. The method according to claim 1, further comprising:
forming at least one additional optical path length-adjusting layer over the first optical path length-adjusting layer,
wherein the at least one additional optical path length-adjusting layer is between the at least two reflective metals and the transparent conductive anode films, and
wherein each pixel region has an optical distance and the optical distance of the red pixel regions is greater than the optical distance of the green pixel regions, and the optical distance of the green pixel regions is greater than the optical distance of the blue pixel regions.

16. A method for producing a light-emitting display device, the method comprising:
forming a film of a light-transmissive resin material on a substrate over which at least two reflective metals are disposed in at least two pixel regions corresponding to red, green or blue,
curing part of the film of the light-transmissive resin material in an environment having an oxygen concentration of 2% or lower, to form a light-transmissive resin layer, the part being in a region including the at least two pixel regions,
developing the light-transmissive resin layer after the curing to form a first optical path length-adjusting layer over a first and second of the at least two reflective metals,
forming transparent conductive anode films over at least a portion of each pixel region,
forming organic light emitting layers on the anode films, and
forming semi-transparent cathode members on the organic light emitting layers over at least a portion of each pixel region,
wherein the first optical path length-adjusting layer is between the at least two reflective metals and the transparent conductive anode films, and
wherein the light-transmissive resin material is formed of 1,10 decanediol methacrylate.

17. The method according to claim 16, further comprising:
forming at least one additional optical path length-adjusting layer over the first optical path length-adjusting layer,
wherein the at least one additional optical path length-adjusting layer is between the at least two reflective metals and the transparent conductive anode films, and
wherein each pixel region has an optical distance and the optical distance of the red pixel regions is greater than the optical distance of the green pixel regions, and the optical distance of the green pixel regions is greater than the optical distance of the blue pixel regions.

18. A method for producing a light-emitting display device, the method comprising:
forming a film of a light-transmissive resin material on a substrate over which at least two reflective metals and corresponding semi-transparent cathode members are disposed in at least two pixel regions corresponding to red, green or blue,
curing part of the film of the light-transmissive resin material through irradiation with UV rays at an intensity of 2J/cm$^2$ or higher, to form a light-transmissive resin layer, the part being in a region including the at least two pixel regions,
developing the light-transmissive resin layer after the curing to form a first optical path length-adjusting layer over a first and second of the at least two reflective metals, and
forming transparent conductive anode films between each reflective metal, and the corresponding semi-transparent cathode member,
wherein the first optical path length-adjusting layer is between the at least two reflective metals and the transparent conductive anode films, and
wherein the light-transmissive resin material is formed of 1,10 decanediol methacrylate.

* * * * *